(12) United States Patent
Yang et al.

(10) Patent No.: US 12,022,697 B2
(45) Date of Patent: Jun. 25, 2024

(54) DISPLAY PANEL, DISPLAY APPARATUS, AND METHOD OF FABRICATING THE DISPLAY PANEL

(71) Applicant: BOE Technology Group Co., Ltd., Beijing (CN)

(72) Inventors: Ming Yang, Beijing (CN); Can Zhang, Beijing (CN); Minghua Xuan, Beijing (CN); Chuanxiang Xu, Beijing (CN); Feng Zhang, Beijing (CN); Zhongyuan Sun, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 29 days.

(21) Appl. No.: 17/751,456

(22) Filed: May 23, 2022

(65) Prior Publication Data

US 2022/0285467 A1    Sep. 8, 2022

Related U.S. Application Data

(62) Division of application No. 16/639,114, filed as application No. PCT/CN2019/110168 on Oct. 9, 2019, now Pat. No. 11,374,074.

(30) Foreign Application Priority Data

Apr. 4, 2019    (CN) .......................... 201910271162.1

(51) Int. Cl.
*H10K 59/124*    (2023.01)
*H10K 50/844*    (2023.01)
(Continued)

(52) U.S. Cl.
CPC ......... *H10K 59/124* (2023.02); *H10K 50/844* (2023.02); *H10K 71/00* (2023.02);
(Continued)

(58) Field of Classification Search
CPC ... H10K 59/124; H10K 59/1201; H10K 71/00
(Continued)

(56) References Cited

U.S. PATENT DOCUMENTS

2008/0185590 A1    8/2008    Kim et al.
2011/0133215 A1*   6/2011    Kang ..................... H10K 71/00
                                                       438/34
(Continued)

FOREIGN PATENT DOCUMENTS

CN    103529575 A    1/2014
CN    106057824 A    10/2016
(Continued)

OTHER PUBLICATIONS

Requirement for Restriction in the U.S. Appl. No. 16/639,114, dated Oct. 1, 2021.
(Continued)

*Primary Examiner* — Dzung Tran
(74) *Attorney, Agent, or Firm* — Intellectual Valley Law, P.C.

(57) ABSTRACT

A method of fabricating a display panel includes forming a first conductive layer on a base substrate, wherein the first conductive layer is formed in an encapsulated area and a peripheral area of the display panel; forming an organic insulating layer on a side of the first conductive layer away from the base substrate, wherein the organic insulating layer is formed to be limited in the encapsulated area; forming a first inorganic insulating layer on a side of the organic insulating layer away from the base substrate; forming a second conductive layer on a side of the organic insulating layer and the first inorganic insulating layer away from the base substrate, wherein the second conductive layer is formed in the encapsulated area and the peripheral area; and forming a second inorganic insulating layer, the second (Continued)

inorganic insulating layer formed between the organic insulating layer and the first conductive layer.

9 Claims, 12 Drawing Sheets

(51) Int. Cl.
*H10K 71/00* (2023.01)
*H10K 59/12* (2023.01)
*H10K 77/10* (2023.01)
*H10K 102/00* (2023.01)

(52) U.S. Cl.
CPC ........ *H10K 59/1201* (2023.02); *H10K 77/111* (2023.02); *H10K 2102/311* (2023.02)

(58) Field of Classification Search
USPC ....................................................... 257/211
See application file for complete search history.

(56) References Cited

U.S. PATENT DOCUMENTS

| | | | |
|---|---|---|---|
| 2014/0009711 A1 | 1/2014 | Tomioka et al. | |
| 2015/0123084 A1 | 5/2015 | Kim et al. | |
| 2016/0035805 A1 | 2/2016 | Kim et al. | |
| 2016/0093647 A1 | 3/2016 | Kim et al. | |
| 2016/0336541 A1 | 11/2016 | Kim et al. | |
| 2017/0141169 A1 | 5/2017 | Kim et al. | |
| 2017/0317159 A1 | 11/2017 | Kim et al. | |
| 2017/0365653 A1 | 12/2017 | Kim et al. | |
| 2018/0102502 A1 | 4/2018 | Kim et al. | |
| 2018/0122882 A1 | 5/2018 | Lee et al. | |
| 2019/0067641 A1 | 2/2019 | Shin et al. | |
| 2019/0165001 A1 | 5/2019 | Yao et al. | |
| 2019/0355799 A1 | 11/2019 | Jeong et al. | |

FOREIGN PATENT DOCUMENTS

| | | | |
|---|---|---|---|
| CN | 106158881 A | 11/2016 | |
| CN | 107293593 A | 10/2017 | |
| CN | 107331790 A | 11/2017 | |
| CN | 107919293 A | 4/2018 | |
| CN | 107946318 A | 4/2018 | |
| CN | 108122944 A | 6/2018 | |
| CN | 109309107 A | 2/2019 | |
| CN | 109428001 A | 3/2019 | |

OTHER PUBLICATIONS

Response to Requirement for Restriction in the U.S. Appl. No. 16/639,114, dated Nov. 8, 2021.
First Office Action in the Chinese Patent Application No. 201910271162.1 dated Aug. 12, 2020; English translation attached.
International Search Report & Written Opinion mailed Jan. 2, 2020, regarding PCT/CN2019/110168.
Non-Final Office Action in the U.S. Appl. No. 16/639,114, dated Nov. 19, 2021.
Response to Non-Final Office Action in the U.S. Appl. No. 16/639,114, dated Feb. 9, 2022.
Notice of Allowance in the U.S. Appl. No. 16/639,114, dated Mar. 8, 2022.

* cited by examiner

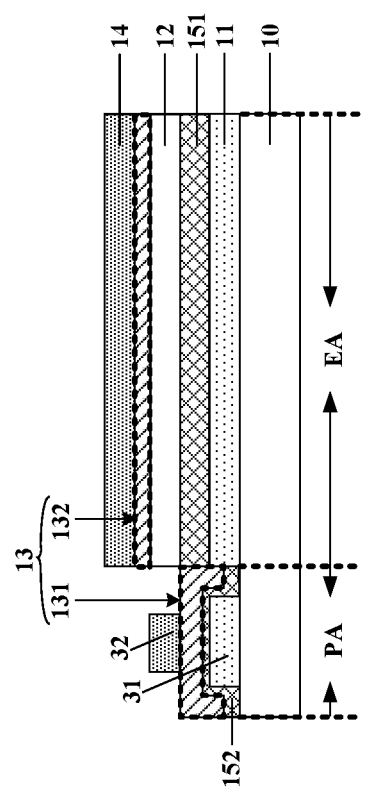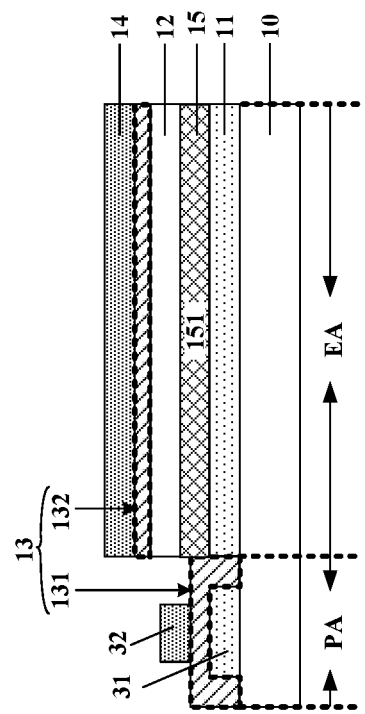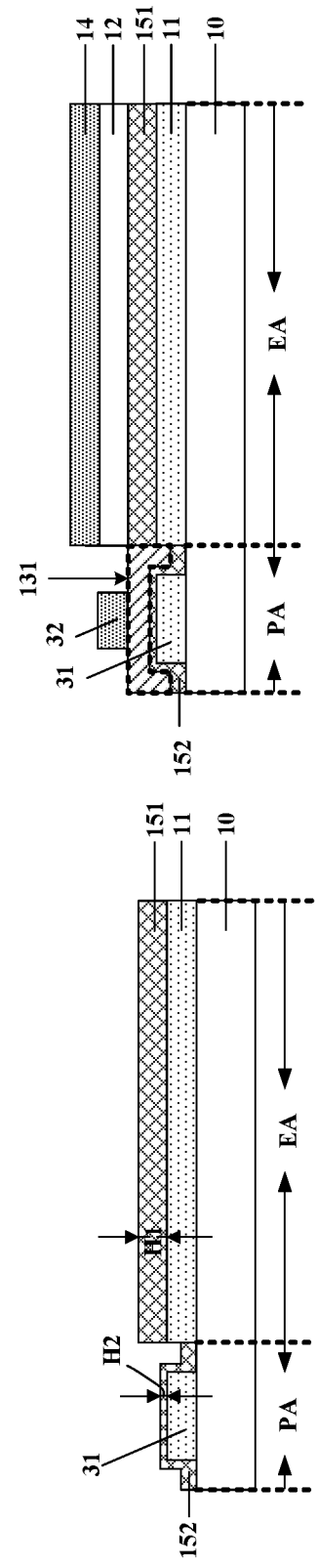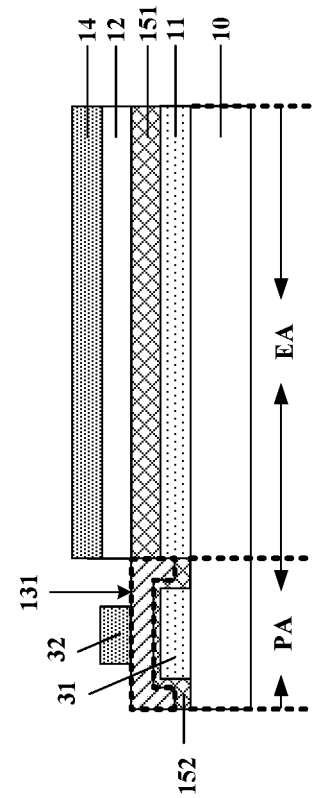

DISPLAY PANEL, DISPLAY APPARATUS, AND METHOD OF FABRICATING THE DISPLAY PANEL

CROSS-REFERENCE TO RELATED APPLICATION

This application is a divisional of U.S. application Ser. No. 16/639,114, filed Oct. 9, 2019, which is a national stage application under 35 U.S.C. § 371 of International Application No. PCT/CN2019/110168, filed Oct. 9, 2019, which claims priority to Chinese Patent Application No. 201910271162.1, filed Apr. 4, 2019. Each of the forgoing applications is herein incorporated by reference in its entirety for all purposes.

TECHNICAL FIELD

The present invention relates to display technology, more particularly, to a display panel, a display apparatus, and a method of fabricating the display panel.

BACKGROUND

In recent years, flexible display devices become more and more popular. The flexible display devices have been widely used in many electronic devices such as mobile phones, computer display panels, touch screens, satellite navigation devices, digital cameras, etc.

SUMMARY

In one aspect, the present invention provides a display panel, comprising a base substrate; a first conductive layer on the base substrate, and in an encapsulated area and a peripheral area of the display panel; a second conductive layer on a side of the first conductive layer away from the base substrate, and in the encapsulated area and the peripheral area; an organic insulating layer between the first conductive layer and the second conductive layer, and limited in the encapsulated area; a first inorganic insulating layer between the first conductive layer and the second conductive layer, and on a side of the organic insulating layer away from the base substrate; and a second inorganic insulating layer between the organic insulating layer and the first conductive layer; wherein, in the peripheral area, an orthographic projection of the first conductive layer on the base substrate at least partially overlaps with an orthographic projection of the second conductive layer on the base substrate; the first inorganic insulating layer comprises a first inorganic insulating sub-layer in the peripheral area, and a second inorganic insulating sub-layer in the encapsulated area; and the first inorganic insulating layer covers the organic insulating layer.

Optionally, the first conductive layer comprises a first gate electrode in the encapsulated area, and a first electrode in the peripheral area; and the second conductive layer comprises a source electrode and a drain electrode in the encapsulated area, and a second electrode in the peripheral area; and an orthographic projection of the first electrode on the base substrate at least partially overlaps with an orthographic projection of the second electrode on the base substrate.

Optionally, the first inorganic insulating layer is a unitary layer continuously extending from the encapsulated area into the peripheral area.

Optionally, a thickness of the first inorganic insulating layer is in a range of 500 Å to 1000 Å.

Optionally, the second inorganic insulating layer comprises a third inorganic insulating sub-layer in the encapsulated area and a fourth inorganic insulating sub-layer in the peripheral area; and the second inorganic insulating layer is a unitary layer continuously extending from the encapsulated area into the peripheral area.

Optionally, a thickness of the fourth inorganic insulating sub-layer is equal to or less than a thickness of the third inorganic insulating sub-layer.

Optionally, the display panel further comprises a third conductive layer on a side of the first conductive layer away from the second conductive layer, and in the encapsulated area; and a third inorganic insulating layer spacing apart the first conductive layer and the third conductive layer.

Optionally, the third conductive layer comprises a second gate electrode; and an orthographic projection of the second gate electrode on the base substrate at least partially overlaps with an orthographic projection of the first gate electrode on the base substrate.

Optionally, the display panel further comprises a plurality of light emitting elements in the encapsulated area; and an encapsulating layer on a side of the plurality of light emitting elements away from the base substrate; wherein the encapsulating layer extends from the encapsulated area into the peripheral area, and is in direct contact with the first inorganic insulating sub-layer, thereby encapsulating the plurality of light emitting elements.

In another aspect, the present invention provides a display apparatus, comprising the display panel described herein or fabricated by a method described herein; and one or more integrated circuits connected to the display panel.

In another aspect, the present invention provides a method of fabricating a display panel, comprising forming a first conductive layer on a base substrate, wherein the first conductive layer is formed in an encapsulated area and a peripheral area of the display panel; forming an organic insulating layer on a side of the first conductive layer away from the base substrate, wherein the organic insulating layer is formed to be limited in the encapsulated area; forming a first inorganic insulating layer on a side of the organic insulating layer away from the base substrate; forming a second conductive layer on a side of the organic insulating layer and the first inorganic insulating layer away from the base substrate, wherein the second conductive layer is formed in the encapsulated area and the peripheral area; and forming a second inorganic insulating layer subsequent to forming the first conductive layer and prior to forming the organic insulating layer, the second inorganic insulating layer formed between the organic insulating layer and the first conductive layer; wherein forming the first inorganic insulating layer comprises forming first inorganic insulating sub-layer in the peripheral area, and a second inorganic insulating sub-layer in the encapsulated area; the first inorganic insulating layer is formed between the first conductive layer and the second conductive layer; the organic insulating layer is formed prior to forming the first inorganic insulating layer; the first inorganic insulating layer covers the organic insulating layer; and an orthographic projection of the first conductive layer on the base substrate at least partially overlaps with an orthographic projection of the second conductive layer on the base substrate.

Optionally, the first inorganic insulating layer is formed as a unitary layer continuously extending from the encapsulated area into the peripheral area.

Optionally, the first inorganic insulating layer is formed to have a thickness in a range of 500 Å to 1000 Å.

Optionally, forming the second inorganic insulating layer further comprises forming a third inorganic insulating sub-layer in the encapsulated area, and a fourth inorganic insulating sub-layer in the peripheral area; and the second inorganic insulating layer is formed as a unitary layer continuously extending from the encapsulated area into the peripheral area.

Optionally, the fourth inorganic insulating sub-layer is formed to have a thickness equal to or less than a thickness of the third inorganic insulating sub-layer.

Optionally, forming the first conductive layer comprises forming a first gate electrode in the encapsulated area, and a first electrode in the peripheral area; and forming the second conductive layer comprises forming a source electrode and a drain electrode in the encapsulated area, and a second electrode in the peripheral area; wherein an orthographic projection of the first electrode on the base substrate at least partially overlaps with an orthographic projection of the second electrode on the base substrate.

Optionally, the method further comprises forming a third conductive layer on a side of the first conductive layer away from the second conductive layer, wherein the third conductive layer is formed in the encapsulated area; and forming a third inorganic insulating layer spacing apart the first conductive layer and the third conductive layer.

Optionally, forming the third conductive layer comprises forming a first gate electrode and a second gate electrode in the encapsulated area; and an orthographic projection of the second gate electrode on the base substrate at least partially overlaps with an orthographic projection of the first gate electrode on the base substrate.

Optionally, the method further comprises forming a plurality of light emitting elements in the encapsulated area; and forming an encapsulating layer on a side of the plurality of light emitting elements away from the base substrate; wherein the encapsulating layer is formed to extend from the encapsulated area into the peripheral area, and is formed to be in direct contact with the first inorganic insulating sub-layer to encapsulate the plurality of light emitting elements.

BRIEF DESCRIPTION OF THE FIGURES

The following drawings are merely examples for illustrative purposes according to various disclosed embodiments and are not intended to limit the scope of the present invention.

FIG. 12 is a schematic diagram of a structure of a display panel in some embodiments according to the present disclosure.

FIG. 13A is a schematic diagram of a structure of a display panel in some embodiments according to the present disclosure.

FIG. 13B illustrates thickness of a third inorganic insulating sub-layer in an encapsulated area and a fourth inorganic insulating sub-layer in a peripheral area of a second inorganic insulating layer in some embodiments according to the present disclosure.

FIG. 14 is a schematic diagram of a structure of a display panel in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

When a top-gate thin film transistor is used in a flexible display device, an inter-layer dielectric layer is formed between gate electrode and the source/drain electrode of the top-gate thin film transistor. In general, the inter-layer dielectric layer is made of inorganic materials. However, the inorganic materials will not improve the flexibility of the flexible display device, so, organic materials having a higher flexibility are used to form the inter-layer dielectric layer instead of the inorganic materials.

Accordingly, the present disclosure provides, inter alia, a display panel, a display apparatus, and a method of fabricating the display panel that substantially obviate one or more of the problems due to limitations and disadvantages of the related art. In one aspect, the present disclosure provides a display panel. In some embodiments, the display panel includes a base substrate; a first conductive layer on the base substrate, and in an encapsulated area and a peripheral area of the display panel; a second conductive layer on a side of the first conductive layer away from the base substrate, and in the encapsulated area and the peripheral area; an organic insulating layer between the first conductive layer and the second conductive layer, and limited in the encapsulated area; a first inorganic insulating layer between the first conductive layer and the second conductive layer, and on a side of the organic insulating layer away from the base substrate; and a second inorganic insulating layer between the organic insulating layer and the first conductive layer. Optionally, an orthographic projection of the first conductive layer on the base substrate at least partially overlaps with an orthographic projection of the second conductive layer on the base substrate. Optionally, the first inorganic insulating layer comprises a first inorganic insulating sub-layer in the peripheral area, and a second inorganic insulating sub-layer in the encapsulated area. Optionally, the first inorganic insulating layer covers the organic insulating layer.

Figure 1:
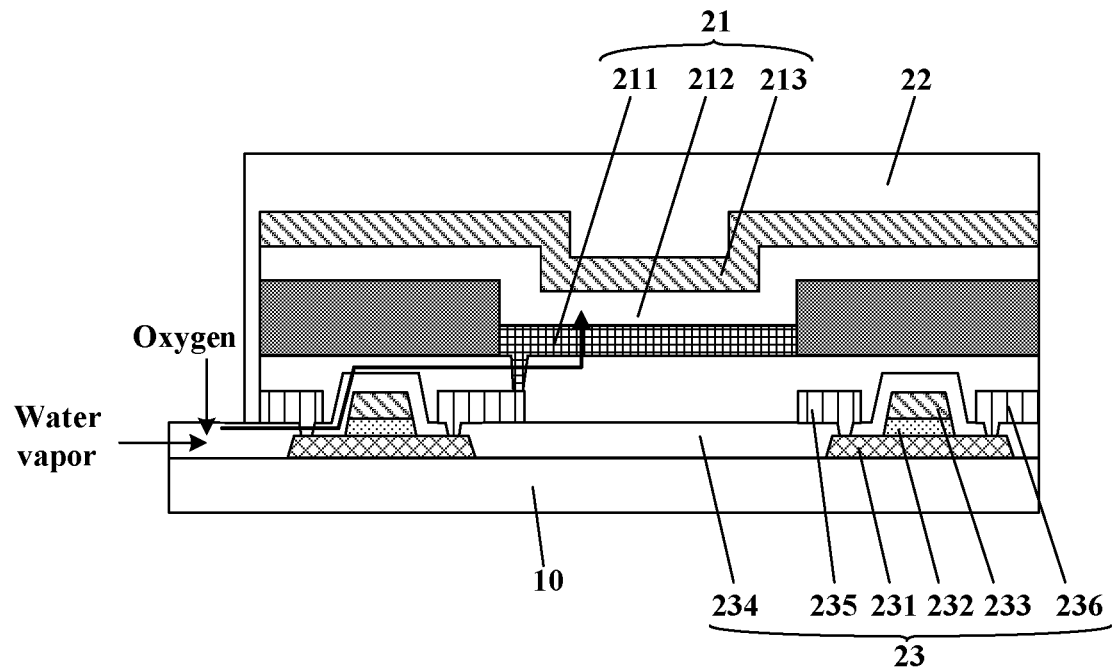
FIG. 1 is a schematic diagram of a structure of a display panel in some embodiments according to the present disclosure.

FIG. 1 is a schematic diagram of a structure of a display panel in some embodiments according to the present disclosure. Referring to FIG. 1, in some embodiments, an inter-layer insulating layer 234 includes an organic material. An encapsulating layer 22 encapsulates the plurality of light emitting elements 21 in an encapsulated area, but a portion of the inter-layer insulating layer 234 is not encapsulated by the encapsulating layer 22. Water vapor and oxygen have a higher penetration rate in organic materials than in inorganic materials, so, it is easy for water vapor and oxygen to penetrate into the display panel through the inter-layer insulating layer 234 made of the organic material. For example, water vapor and oxygen may penetrate into the display panel along a route shown by arrows in FIG. 1. Penetrations of water vapor and oxygen into the display panel denatures the plurality of light emitting elements in the display panel, resulting in display abnormality of the display panel, so that the display panel will not pass the reliability verification test. Optionally, a respective one of the plurality of light emitting elements 21 is OLED.

Figure 2:
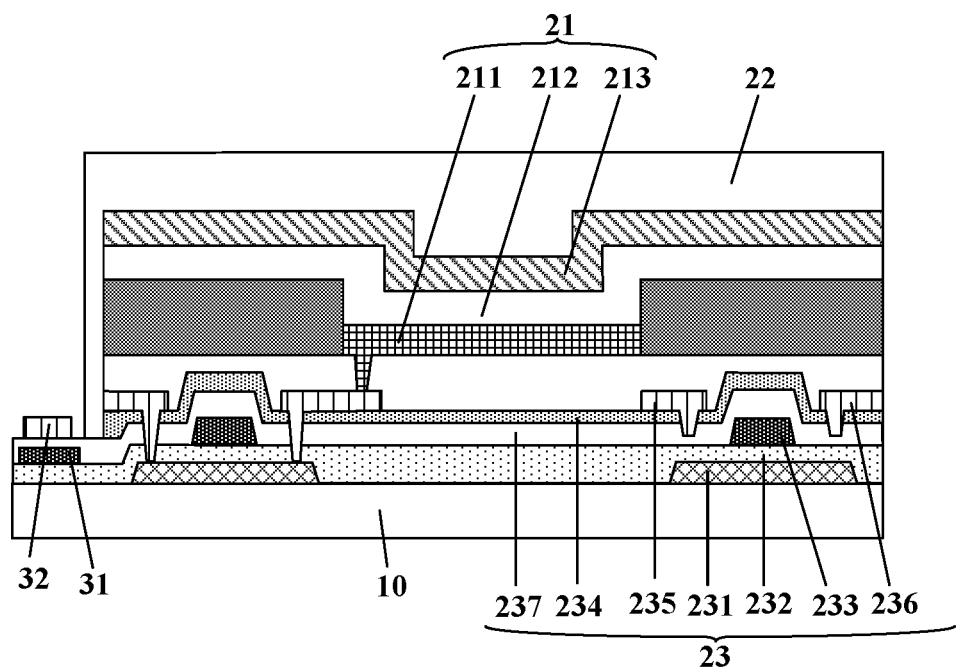
FIG. 2 is a schematic diagram of a structure of a display panel in some embodiments according to the present disclosure.

FIG. 2 is a schematic diagram of a structure of a display panel in some embodiments according to the present disclosure. In some embodiments, referring to FIG. 2, the encapsulating layer 22 encapsulates the inter-layer insulating layer 234, for example, an orthographic projection the encapsulating layer 22 on a base substrate 10 covers an orthographic projection of the inter-layer insulating layer 234 on the base substrate 10, so that the encapsulating layer 22 can prevent the water vapor and oxygen from penetrating into the display panel through the inter-layer insulating layer 234 and from reaching the plurality of light emitting elements 21.

In some embodiments, forming the inter-layer insulating layer 234 includes forming an organic material layer on the base substrate; applying a photoresist on a side of the organic material layer away from the base substrate; exposing the photoresist; developing the photoresist; etching the organic material layer to form the inter-layer insulating layer 234. Optionally, the base substrate is a flexible base substrate.

During the process of etching the organic material layer, a portion of the organic material layer is over-etched, so that an inter-layer medium layer 237, which is in direction contact with the inter-layer insulating layer 234 and on a side of the inter-layer insulating layer 234 closer to the base substrate 10, is etched. Moreover, the inter-layer medium layer 237 is etched to expose a portion of surface of the first electrode 31 which is on a side of the inter-layer medium layer 237 closer to the base substrate 10, so that the first electrode 31 is electrically connected to a second electrode 32 on a side of the inter-layer medium layer 237 away from the base substrate 10, and a short is formed between the first electrode 31 and the second electrode 32, resulting in abnormal display of the display panel.

Optionally, a thickness of the inter-layer insulating layer 234 is 5000 Å, e.g., 1000 Å to 2000 Å, 2000 Å to 3000 Å, 3000 Å to 4000 Å, and 4000 Å to 5000 Å. For example, the inter-layer insulating layer 234 includes a layer having $SiO_x$ and a layer having $SiN_x$. A thickness of the layer having $SiO_x$ is 2000 Å, a thickness of the layer having $SiN_x$ is 3000 Å.

Figure 3:
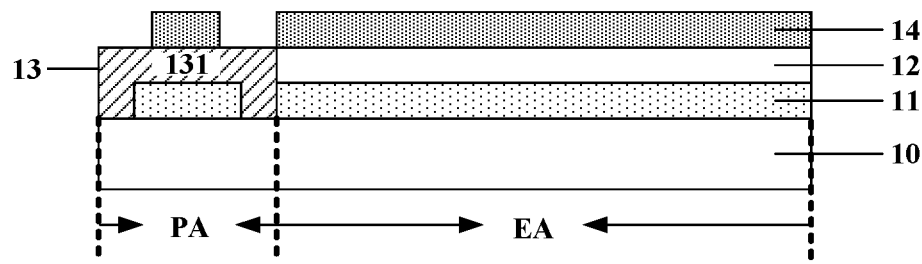
FIG. 3 is a schematic diagram of a structure of a display panel in some embodiments according to the present disclosure.
Figure 4:
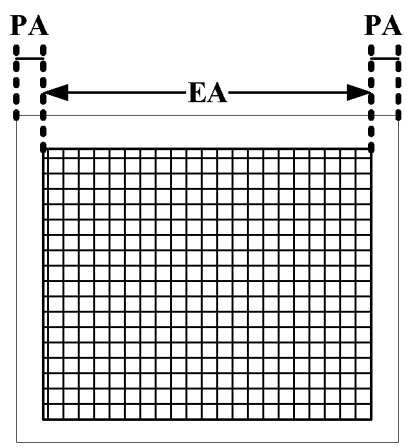
FIG. 4 is a plan view of a display panel in some embodiments according to the present disclosure.

FIG. 3 is a schematic diagram of a structure of a display panel in some embodiments according to the present disclosure. FIG. 4 is a plan view of a display panel in some embodiments according to the present disclosure. In some embodiments, referring to FIG. 3 and FIG. 4, the display panel includes an encapsulated area EA and a peripheral area PA.

As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area where various circuits and wires are provided to transmit signals to the display panel. To increase the transparency of a display apparatus, non-transparent or opaque components of the display apparatus (e.g., battery, printed circuit board, metal frame), can be disposed in the peripheral area rather than in the display area.

As used herein, the term "encapsulated area" refers to an area of the display panel throughout which the encapsulating layer extends. The display area is encapsulated. Optionally, the encapsulated area includes an entirety of the display area. Optionally, the encapsulated area further includes at least a portion of the peripheral area.

In some embodiments, referring to FIG. 3, the display panel includes a base substrate 10; a first conductive layer 11 on the base substrate 10; and a second conductive layer 14 on a side of the first conductive layer 11 away from the base substrate 10. Optionally, first conductive layer 11 is in the encapsulated area EA and the peripheral area PA of the display panel. Optionally, the second conductive layer 14 is in the encapsulated area and the peripheral area.

Figure 5:
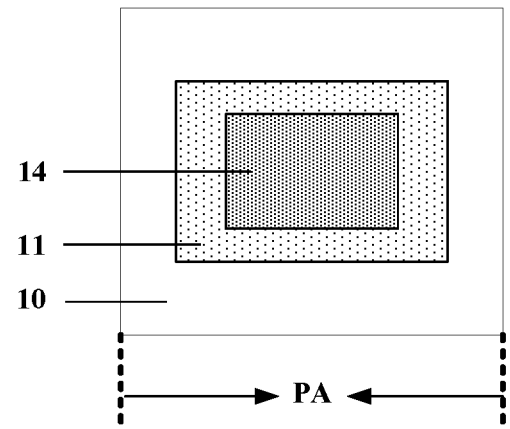
FIG. 5 is a plan view of a first conductive layer and a second conductive layer in a peripheral area in some embodiments according to the present disclosure.

FIG. 5 is a plan view of a first conductive layer and a second conductive layer in a peripheral area in some embodiments according to the present disclosure. Optionally, referring to FIG. 3 and FIG. 5, in the peripheral area PA, an orthographic projection of the first conductive layer 11 on the base substrate 10 at least partially overlaps with an orthographic projection of the second conductive layer 14 on the base substrate 10. In one example, the orthographic projection of the first conductive layer 11 on the base substrate 10 partially overlaps with the orthographic projection of the second conductive layer 14 on the base substrate 10. In another example, the orthographic projection of the first conductive layer 11 on the base substrate 10 completely overlaps with the orthographic projection of the second conductive layer 14 on the base substrate 10.

Figure 6:
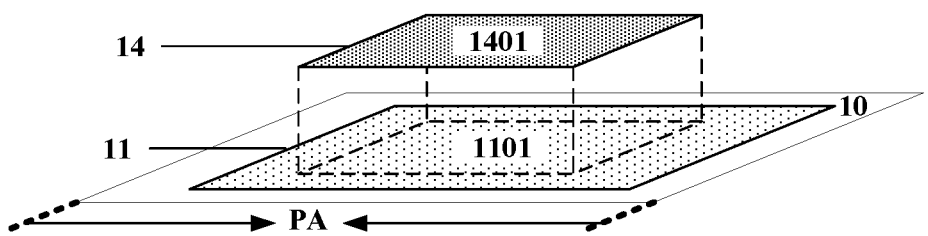
FIG. 6 is a schematic diagram of a first conductive layer and a second conductive layer in a peripheral area in some embodiments according to the present disclosure.

FIG. 6 is a schematic diagram of a first conductive layer and a second conductive layer in a peripheral area in some embodiments according to the present disclosure. For example, referring to FIG. 6, an orthographic projection of a first portion 1101 of the first conductive layer 11 in the peripheral area PA completely overlaps with an orthographic projection of a second portion 1401 of the second conductive layer 14 in the peripheral area PA. The first portion 1101 of the first conductive layer 11 and the second portion 1401 of the second conductive layer 14 forms a capacitor. For example, the capacitor is a capacitor in the circuit of Gate-On-Array (GOA).

In some embodiments, referring to FIG. 3, the display panel includes an organic insulating layer 12 between the first conductive layer 11 and the second conductive layer 14. Optionally, the organic insulating layer 12 is limited in the encapsulated area EA.

Figure 7:
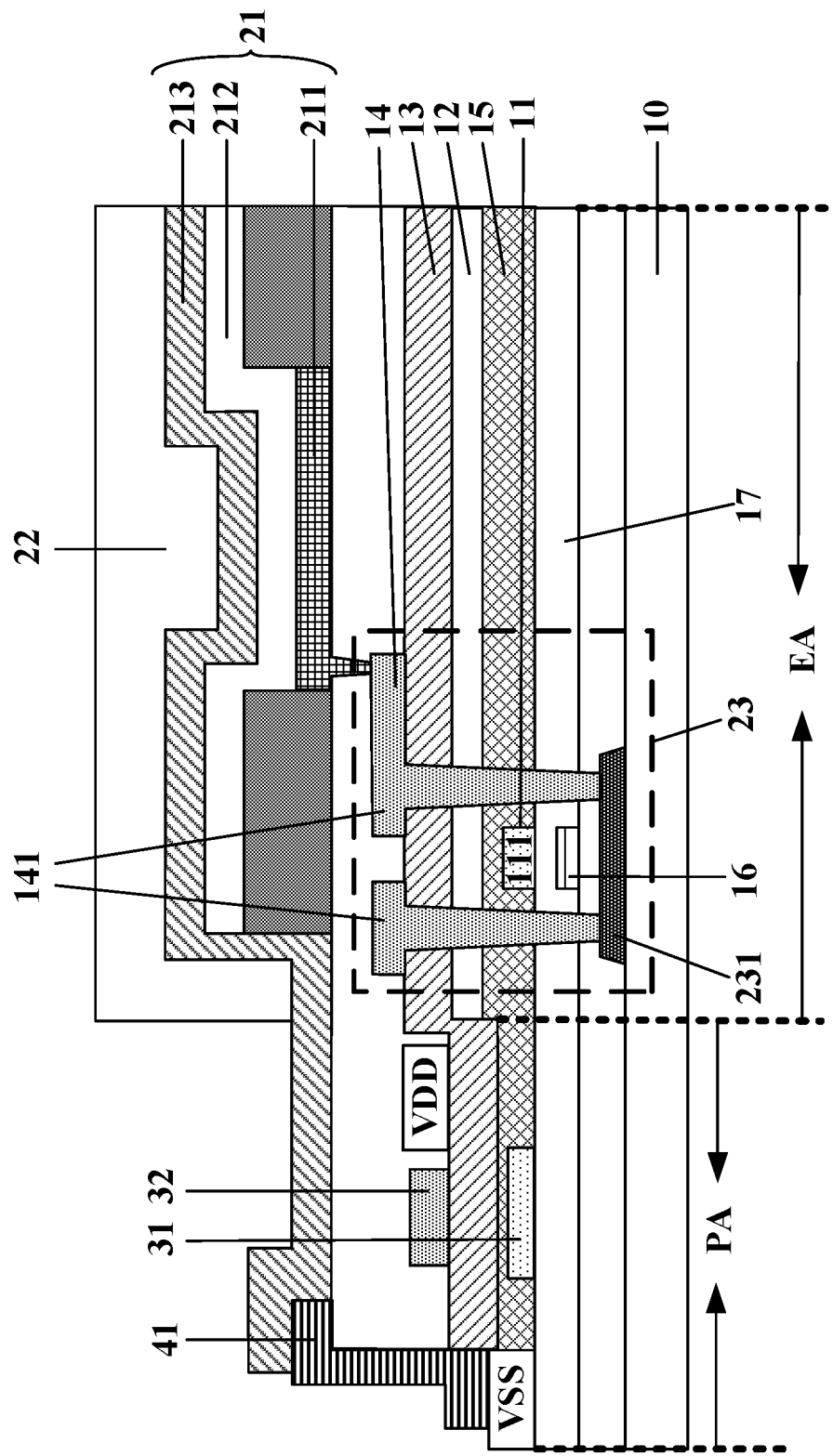
FIG. 7 is a schematic diagram of a structure of a display panel in some embodiments according to the present disclosure.

FIG. 7 is a schematic diagram of a structure of a display panel in some embodiments according to the present disclosure. Referring to FIG. 3 and FIG. 7, in some embodiments, the display panel includes a first inorganic insulating layer 13 between the first conductive layer 11 and the second conductive layer 14. Optionally, the first inorganic insulating layer 13 includes a first inorganic insulating sub-layer 131 in the peripheral area PA.

Various appropriate materials may be used for making the base substrate 10. Examples of materials suitable for making the base substrate include, but are not limited to, glass, quartz, polyimide, and polyester, etc. For example, the base substrate is a flexible base substrate made of polyimide.

Optionally, the first conductive layer 11 and the second conductive layer 14 extend throughout the encapsulated area EA and the peripheral area PA. Optionally, referring to FIG. 3, the first conductive layer 11 has a first pattern. The second conductive layer 14 has a second pattern.

Various appropriate conductive materials and various appropriate fabricating methods may be used to make the first conductive layer. For example, a conductive metal material may be deposited on the substrate by magnetron sputtering, vapor deposition (e.g., plasma-enhanced chemical vapor deposition), or vacuum deposition. Examples of appropriate conductive materials for making the first conductive layer include, but are not limited to, molybdenum, copper, titanium, tantalum, aluminum, molybdenum, chromium, various alloys or laminates thereof, and substantially transparent materials such as indium tin oxide. Optionally, the first conductive layer has a single-layer structure. Optionally, the first conductive layer has a stacked-layer structure including two or more sub-layers.

Various appropriate conductive materials and various appropriate fabricating methods may be used to make the second conductive layer. For example, a conductive metal material may be deposited on the substrate by magnetron sputtering, vapor deposition (e.g., plasma-enhanced chemical vapor deposition), or vacuum deposition. Examples of appropriate conductive materials for making the second conductive layer include, but are not limited to, molybdenum, copper, titanium, tantalum, aluminum, molybdenum, chromium, various alloys or laminates thereof, and substantially transparent materials such as indium tin oxide. Optionally, the second conductive layer has a single-layer structure. Optionally, the second conductive layer has a stacked-layer structure including two or more sub-layers.

Optionally, the first conductive layer and the second conductive layer include a same conductive material. Optionally, a conductive material of the second conductive layer is different from a conductive material of the second conductive layer.

In the peripheral area PA, optionally, the first conductive layer 11 and the second conductive layer 14 are electrically connected, optionally, the first conductive layer 11 and the second conductive layer 14 are spaced apart, for example, the first conductive layer 11 and the second conductive layer 14 are insulated in the peripheral area PA.

Optionally, the first conductive layer 11 includes a gate electrode of a thin film transistor in the encapsulated area EA, the second conductive layer 14 includes a source electrode and a drain electrode of a thin film transistor in the encapsulated area EA. The organic insulating layer 12 between the first conductive layer 11 and the second conductive layer 14 is an inter-layer insulating layer 234 of the thin film transistor.

Various appropriate materials may be used for making the organic insulating layer. Examples of materials suitable for making the organic insulating layer include, but are not limited to, resin.

Various appropriate materials may be used for making the first inorganic insulating layer. Examples of materials suit- able for making the first inorganic insulating layer include, but are not limited to, $SiO_x$, $SiO_xN_y$, and $SiN_x$.

Optionally, a thickness of the first inorganic insulating sub-layer 131 is in a range of 500 Å to 5000 Å, e.g., 500 Å to 1000 Å, 1000 Å to 2000 Å, 2000 Å to 3000 Å, 3000 Å to 4000 Å, and 4000 Å to 5000 Å.

Optionally, the first inorganic insulating sub-layer 131 extends substantially throughout an entire of the peripheral area PA. Optionally, the first inorganic insulating sub-layer 131 is in a portion of the peripheral area PA, as long as the first inorganic insulating sub-layer 131 space apart the first conductive layer 11 and the second conductive layer 14 in the peripheral area PA.

As used herein, the term "substantially throughout" refers at least 50%, at least 60%, at least 70%, at least 80%, at least 90%, at least 95%, at least 99%, or 100% throughout. For example, the first inorganic insulating sub-layer extends at least 50%, at least 60%, at least 70%, at least 80%, at least 90%, at least 95%, at least 99%, or 100% throughout the peripheral area PA.

Optionally, forming the first inorganic insulating layer 13 and the organic insulating layer 12 includes forming the first inorganic insulating layer 13 prior to forming the organic insulating layer 12. Subsequent to forming the organic insulating layer 12, the first inorganic insulating layer 13 in the peripheral area PA should be thick enough to space apart the portion of the first conductive layer 11 in the peripheral area PA and the portion of the second conductive layer 14 in the peripheral area PA. For example, the portion of the first conductive layer 11 in the peripheral area PA and the portion of the second conductive layer 14 in the peripheral area PA are insulated from each other by the first inorganic insulating layer 13.

Optionally, forming the first inorganic insulating layer 13 and the organic insulating layer 12 includes forming the first inorganic insulating layer 13 subsequent to forming the organic insulating layer 12.

Optionally, the display panel is a self-luminous display panel.

In some embodiment, referring to FIG. 7, the display panel is an OLED display panel including a plurality of light emitting elements 21 in the encapsulated area EA, and an encapsulating layer 22 on a side of the plurality of light emitting elements 21 away from the base substrate 10. Optionally, the encapsulating layer 22 encapsulates the plurality of light emitting elements 21 and the organic insulating layer 12. For example, an orthographic projection of the encapsulating layer 22 on the base substrate 10 covers an orthographic projection of the organic insulating layer 12 and orthographic projections of the plurality of light emitting elements 21.

Optionally, the encapsulating layer 22 is not in direct contact with the organic insulating layer 12. Optionally, the encapsulating layer 22 is spaced apart from the organic insulating layer 12 by the first inorganic insulating layer 13.

Optionally, the encapsulating layer 22 has a single-layer structure. Optionally, the encapsulating layer 22 is a multi-layer structure.

In some embodiments, a respective one of the plurality of light emitting elements 21 includes a first electrode layer 211, a light emitting layer 212, and a second electrode layer 213. Optionally, the first electrode layer 211 and the second electrode layer 213 are different electrodes selected from a group consisting of an anode and a cathode.

When the first electrode layer 211 is the anode, and the second electrode layer 213 is the cathode, the display panel further includes an auxiliary electrode 41 in the peripheral area PA, and the auxiliary electrode 41 is formed in a same patterning process as forming the first electrode layer 211. The auxiliary electrode 41 is electrically connected to a first power end VSS and the second electrode layer 213, so that the first power end VSS can provide a low voltage to the second electrode layer 213 through the auxiliary electrode 41. Optionally, the display panel further includes a second power end VDD in the peripheral area PA. The second power end VDD is electrically connected to a source electrode of a driving thin film transistor to provide a high voltage to the source electrode of the driving thin film transistor, so the high voltage is applied to the first electrode layer 211 through the driving thin film transistor. Optionally, the first power end VSS and the second power end VDD are electrically connected to the GOA circuit.

Because the organic insulating layer 12 is in the encapsulated area EA, the organic insulating layer 12 is covered by the encapsulating layer 22, which may prevent water vapor and oxygen from penetrating into the plurality of light emitting elements 21 through the organic insulating layer 12. The water vapor will not have an adverse effect on the plurality of light emitting elements 21, and the display quality of the display panel will not be adversely affected.

Moreover, because the organic insulating layer 12 is limited in the encapsulated area EA, the first inorganic insulating sub-layer 131 of the first inorganic insulating layer 13 is necessary to be formed in the peripheral area PA and to space apart the portion of the first conductive layer 11 in the peripheral area PA and the portion of the second conductive layer 14 in the peripheral area PA, so that a short between the portion of the first conductive layer 11 in the peripheral area PA and the portion of the second conductive layer 14 in the peripheral area PA can be avoided.

Figure 8:
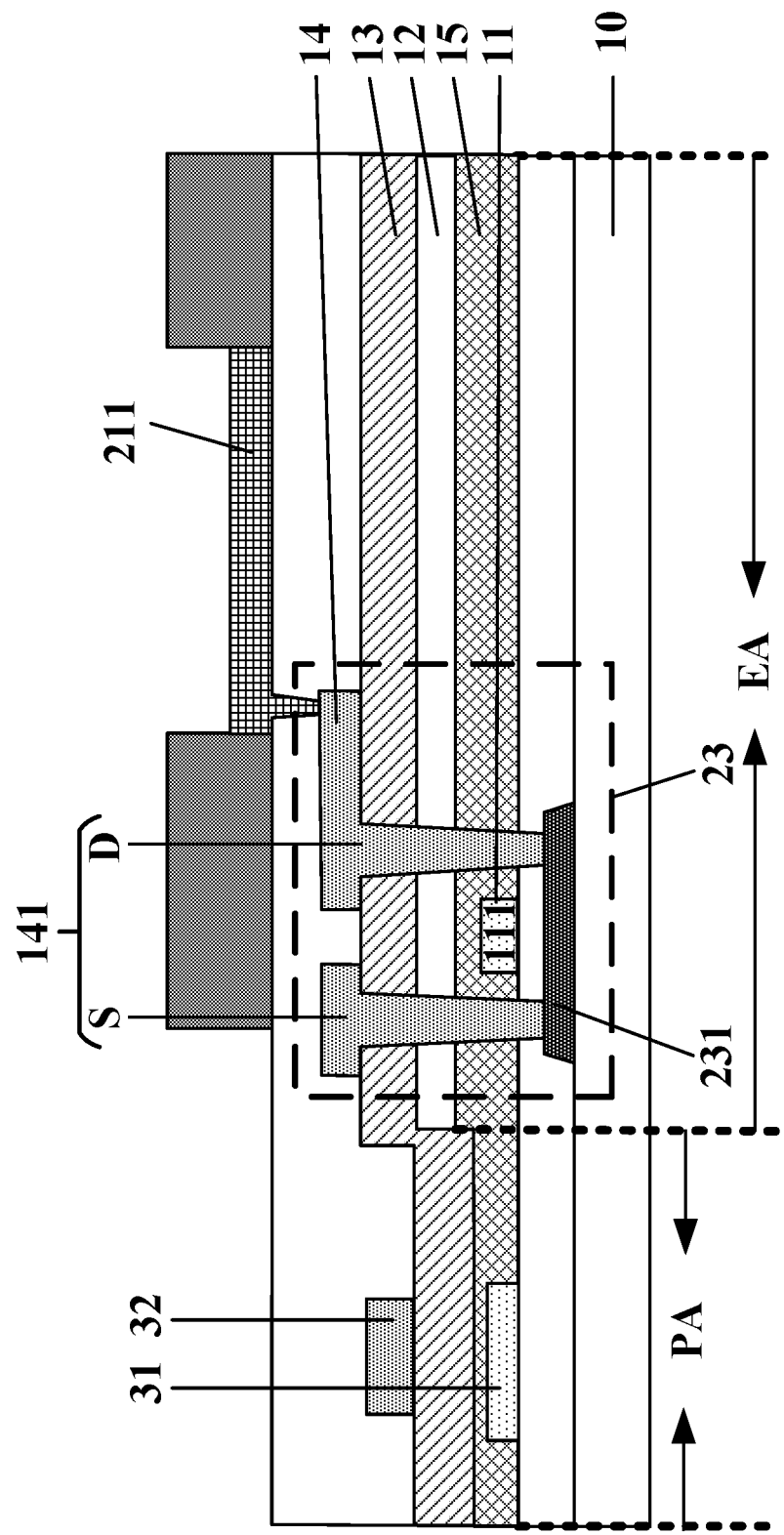
FIG. 8 is a schematic diagram of a structure of a display panel in some embodiments according to the present disclosure.

FIG. 8 is a schematic diagram of a structure of a display panel in some embodiments according to the present disclosure. In some embodiments, referring to FIG. 8, in some embodiments, the first conductive layer 11 includes a first gate electrode 111 in the encapsulated area EA, and a first electrode 31 in the peripheral area PA.

In some embodiments, the second conductive layer 14 includes a source and drain electrode sub-layer 141 in the encapsulated area EA, and a second electrode 32 in the peripheral area PA. Optionally, the first gate electrode 111 and the first electrode 31 are formed in a same layer. Optionally, the source and drain electrode sub-layer 141 and the second electrode 32 are formed in a same layer. The source and drain electrode sub-layer 141 includes a source electrode S and a drain electrode D in a same thin film transistor.

As used herein, the term "same layer" refers to the relationship between the layers simultaneously formed in the same step. In one example, the first gate electrode and the first electrode are in a same layer when they are formed as a result of one or more steps of a same patterning process performed in a material deposited in a same deposition process. In another example, the first gate electrode and the first electrode can be formed in a same layer by simultaneously performing the step of forming the first gate electrode and the step of forming the first electrode. The term "same layer" does not always mean that the thickness of the layer or the height of the layer in a cross-sectional view is the same.

For example, the first gate electrode 111 and the first electrode 31 are formed by a same patterning process. The source electrode S, the drain electrode D, and the second electrode 32 are formed by a same patterning process.

Figure 9:
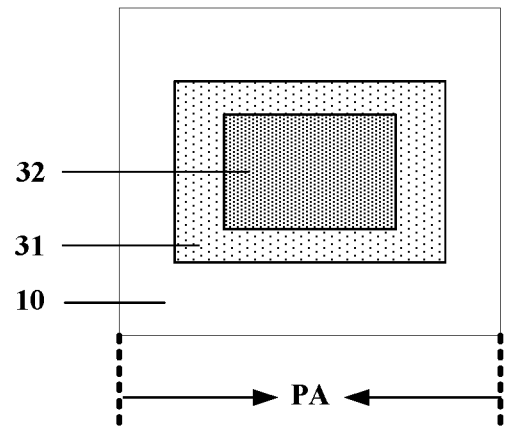
FIG. 9 is a plan view of the first electrode and the second electrode in some embodiments according to the present disclosure.

FIG. 9 is a plan view of the first electrode and the second electrode in some embodiments according to the present disclosure. Optionally, referring to FIG. 8 and FIG. 9, an orthographic projection of the first electrode 31 on the base substrate 10 at least partially overlaps with an orthographic projection of the second electrode 32 on the base substrate 10. In one example, the orthographic projection of the first electrode 31 on the base substrate 10 partially overlaps with the orthographic projection of the second electrode 32 on the base substrate 10. In another example, the orthographic projection of the first electrode 31 on the base substrate 10 completely overlaps with the orthographic projection of the second electrode 32 on the base substrate 10.

Optionally, the display panel includes an array substrate having a plurality of thin film transistors 23. For example, a respective one of the plurality of thin film transistors 23 are a top-gate thin film transistor.

Optionally, the display panel includes a plurality of data lines. A respective one of the plurality of data lines is electrically connected to a source electrode S of a respective one of the plurality of thin film transistors 23. Optionally, the respective one of the plurality of data lines, the source electrode S, and the drain electrode D are in a same layer. For example, the respective one of the plurality of data lines, the source electrode S, and the drain electrode D are formed by a same patterning process.

Optionally, referring to FIG. 8, the respective one of the plurality of thin film transistors includes an active layer 231 on a side of the first gate electrode 111 closer to the base substrate 10. The source electrode S and the drain electrode D are electrically connected to the active layer 231.

Optionally, the first gate electrode 111 of the first conductive layer 11, the source electrode S and the drain electrode D of the second conductive layer 14 can be used to form a top-gate thin film transistor to drive the display panel.

Figure 10:
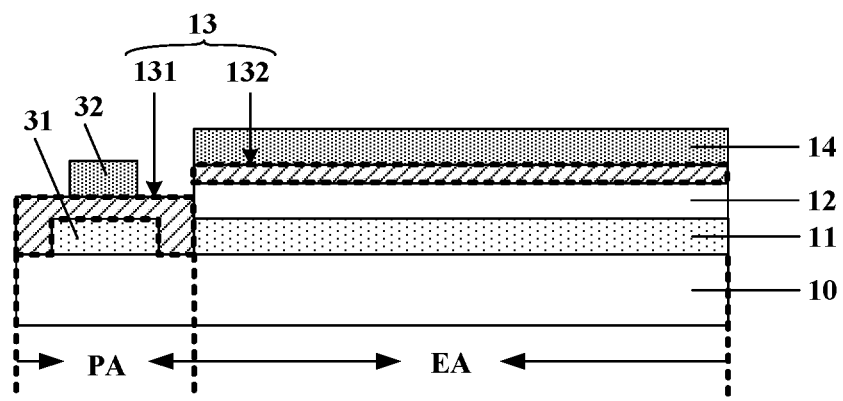
FIG. 10 is a schematic diagram of a structure of a display panel in some embodiments according to the present disclosure.
Figure 11:
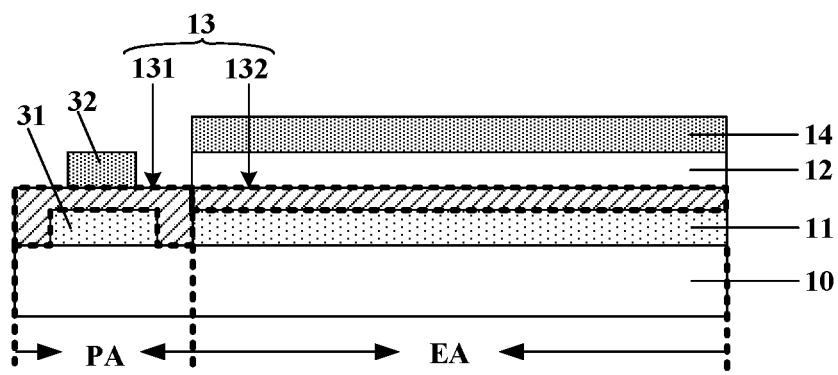
FIG. 11 is a schematic diagram of a structure of a display panel in some embodiments according to the present disclosure.

FIG. 10 is a schematic diagram of a structure of a display panel in some embodiments according to the present disclosure. FIG. 11 is a schematic diagram of a structure of a display panel in some embodiments according to the present disclosure. In some embodiments, referring to FIG. 10 and FIG. 11, the first inorganic insulating layer 13 further includes a second inorganic insulating sub-layer 132 in the encapsulated area EA. Optionally, the first inorganic insulating sub-layer 131 and the second inorganic insulating sub-layer 132 together form a unitary layer continuously extending from the encapsulated area EA into the peripheral area PA.

Optionally, a thickness of the second inorganic insulating sub-layer 132 is in a range of 500 Å to 1000 Å, e.g., 500 Å to 600 Å, 600 Å to 700 Å, 700 Å to 800 Å, 800 Å to 900 Å, and 900 Å to 1000 Å. The second inorganic insulating sub-layer 132 is thinner than an inter-layer insulating layer 234 of a conventional thin film transistor. If a flexible display panel has a thinner inorganic layer, it is easier for the flexible display panel to be bent. So, the inorganic layers described in the present disclosure are thinner and will have little adverse effect on a flexibility of a flexible display panel.

Referring to FIG. 10, optionally, the second inorganic insulating sub-layer 132 is on a side of the organic insulating layer 12 away from the base substrate 10. Referring to FIG. 11, optionally, the second inorganic insulating sub-layer 132 is on a side of the organic insulating layer 12 closer to the base substrate 10.

When the second inorganic insulating sub-layer 132 is on a side of the organic insulating layer 12 away from the base substrate 10, the first inorganic insulating sub-layer 131 should be thick enough to space apart the first electrode 31 and the second electrode 32.

Optionally, the second inorganic insulating sub-layer 132 and the organic insulating layer 12 have a same pattern. Optionally, the second inorganic insulating sub-layer 132 and the organic insulating layer 12 have different patterns.

When the second inorganic insulating sub-layer 132 and the organic insulating layer 12 have a same pattern, vias extending into the second inorganic insulating sub-layer 132 and vias extending into the organic insulating layer 12 can be formed in a same etching process.

The first inorganic insulating layer 13 includes the first inorganic insulating sub-layer 131 in the peripheral area PA and the second inorganic insulating sub-layer 132 in the encapsulated area EA, and the first inorganic insulating sub-layer 131 and the second inorganic insulating sub-layer 132 together form the unitary layer, which can lower the cost of fabricating the display panel, because to form the first inorganic insulating sub-layer 131 and the second inorganic insulating sub-layer 132, when an organic material layer is formed on the base substrate, it is unnecessary to etch a portion of organic material layer in the encapsulated area EA, so no mask is needed for etching the portion of organic material layer in the encapsulated area EA.

FIG. 12 is a schematic diagram of a structure of a display panel in some embodiments according to the present disclosure. In some embodiments, referring to FIG. 12, the first inorganic insulating layer 13 is on a side of the organic insulating layer 12 away from the base substrate 10.

In some embodiments, the display panel further includes a second inorganic insulating layer 15 between the organic insulating layer 12 and the first conductive layer 11. Optionally, the second inorganic insulating layer 15 includes a third inorganic insulating sub-layer 151 in the encapsulated area EA.

Various appropriate materials may be used for making the second inorganic insulating layer. Examples of materials suitable for making the second inorganic insulating layer include, but are not limited to, $SiO_x$, $SiO_xN_y$, and $SiN_x$. Optionally, the first inorganic insulating layer and the second inorganic insulating layer includes a same material. Optionally, a material of the first inorganic insulating layer is different from a material of the second inorganic insulating layer.

The first conductive layer 11 can be in better contact with inorganic materials than with organic materials. When the first inorganic insulating layer 13 is on a side of the organic insulating layer 12 away from the base substrate 10, the second inorganic insulating layer 15 is formed between the first conductive layer 11 and the organic insulating layer 12 to allow the first conductive layer to be in better contact with an inorganic layer. By forming the first inorganic insulating layer 13 on a side of the organic insulating layer 12 away from the base substrate 10, during the process of forming the organic insulating layer 12, the first inorganic insulating layer 13 will not be etched.

FIG. 13A is a schematic diagram of a structure of a display panel in some embodiments according to the present disclosure. In some embodiments, referring to FIG. 13A, the second inorganic insulating layer 15 further includes a fourth inorganic insulating sub-layer 152 in the peripheral area PA. Optionally, the third inorganic insulating sub-layer 151 and the fourth inorganic insulating sub-layer 152 together forms a unitary layer continuously extending from the encapsulated area EA into the peripheral area PA. FIG. 13B illustrates thickness of a third inorganic insulating sub-layer in an encapsulated area and a fourth inorganic insulating sub-layer in a peripheral area of a second inorganic insulating layer in some embodiments according to the present disclosure. Referring to FIG. 13B, the third inorganic insulating sub-layer 151 in the encapsulated area EA has a first thickness H1, and the fourth inorganic insulating sub-layer 152 in the peripheral area PA has a second thickness H2. H2≤H1. Optionally, H2<H1.

Optionally, a thickness of the fourth inorganic insulating sub-layer 152 is equal to or less than a thickness of the third inorganic insulating sub-layer 151.

Because the second inorganic insulating layer 15 is on a side of the organic insulating layer 12 closer to the base substrate 10, prior to forming the organic insulating layer 12, an inorganic material layer is formed on the base substrate 10, and the inorganic material layer is used to form the second inorganic insulating layer 15; an organic material layer is formed on a side of the inorganic material layer away from the base substrate, and the organic material layer is used to form the organic insulating layer 12. Because the organic insulating layer 12 is limited in the encapsulated area EA, a portion of the organic material layer in the peripheral area PA should be removed using an etching process. In the process of etching, in one example, there may be over-etching on the inorganic material layer, so that the thickness of the fourth inorganic insulating sub-layer 152 is less than the thickness of the third inorganic insulating sub-layer 151; in another example, there may not be over-etching on the inorganic material layer and the portion of the organic material layer is completely removed from the peripheral area PA, the thickness of the fourth inorganic insulating sub-layer 152 is equal to the thickness of the third inorganic insulating sub-layer 151.

Because the second inorganic insulating layer 15 is between the first conductive layer 11 and the second conductive layer 14, the fourth inorganic insulating sub-layer 152 of the second inorganic insulating layer 15 can cooperate with the first inorganic insulating sub-layer 131 of the first inorganic insulating layer 13 to space apart the first conductive layer 11 and the second conductive layer 14, especially when the first inorganic insulating sub-layer 131 is relatively thin.

FIG. 14 is a schematic diagram of a structure of a display panel in some embodiments according to the present disclosure. In some embodiments, referring to FIG. 14, the first inorganic insulating layer 13 includes the first inorganic insulating sub-layer 131 in the peripheral area PA, but does not include the second inorganic insulating sub-layer 132 in the encapsulated area EA. Optionally, the second inorganic insulating layer 15 is between the first conductive layer 11 and the organic insulating layer 12.

Figure 15:
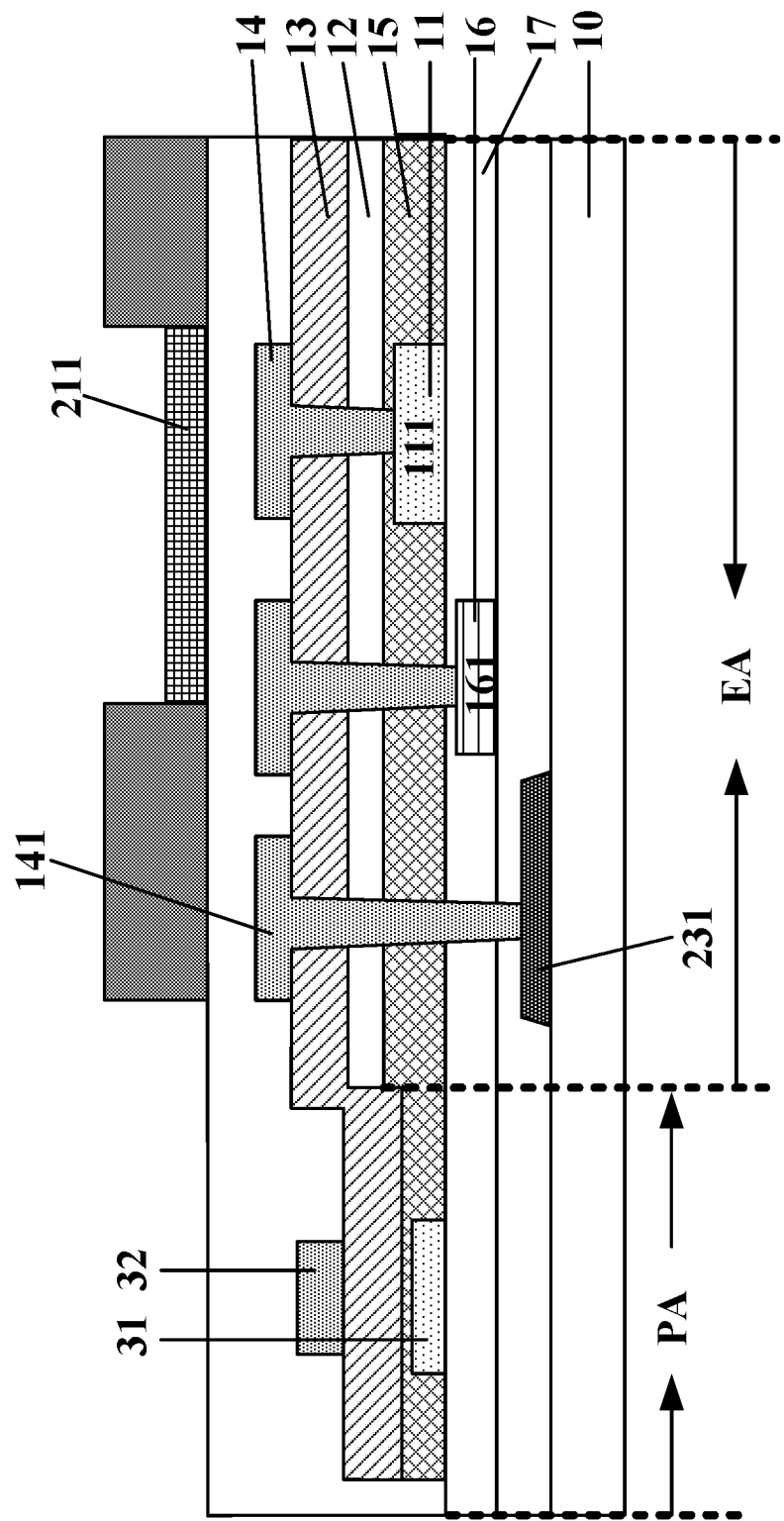
FIG. 15 is a schematic diagram of a structure of a display panel in some embodiments according to the present disclosure.
Figure 16:
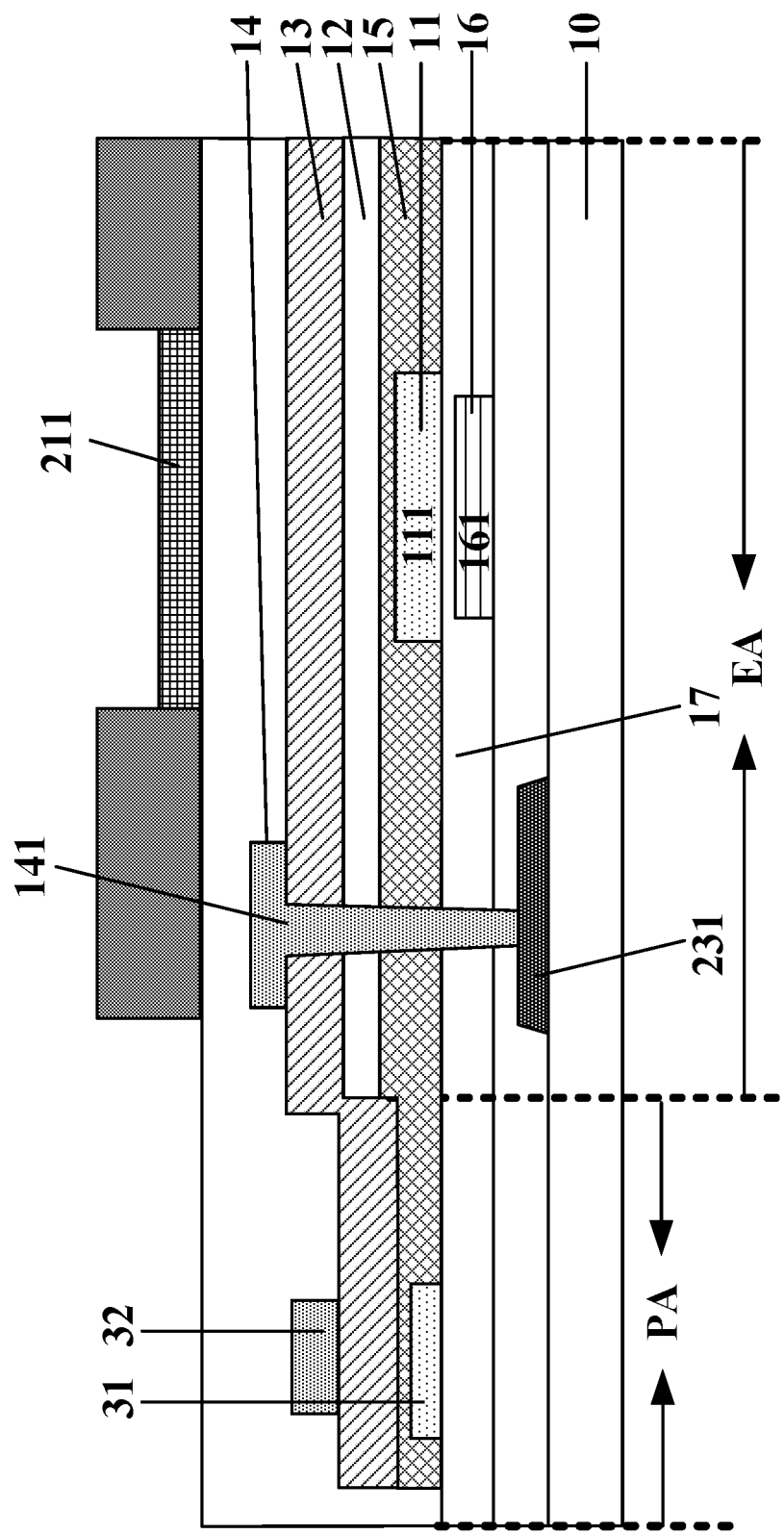
FIG. 16 is a schematic diagram of a structure of a display panel in some embodiments according to the present disclosure.
Figure 17:
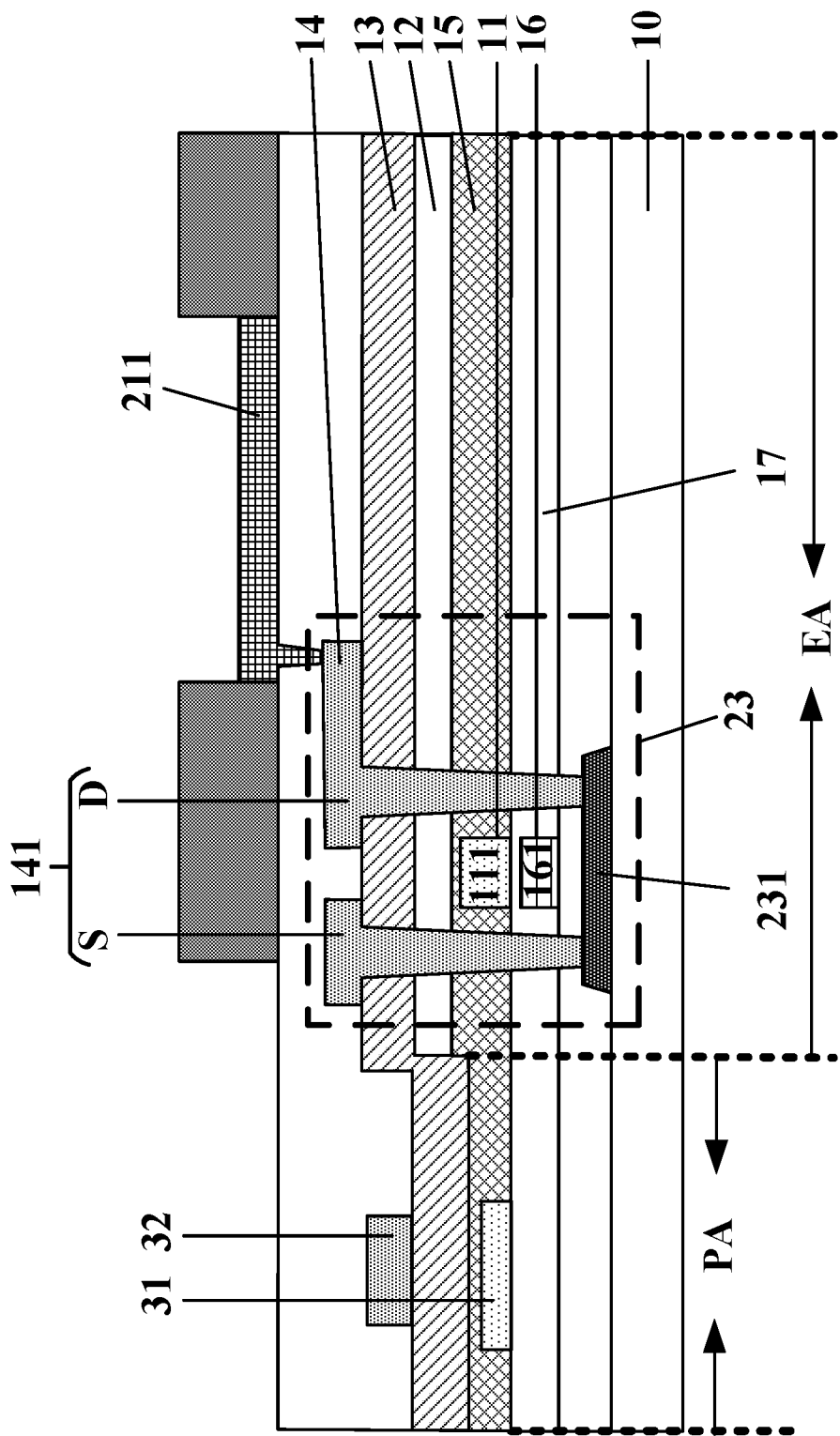
FIG. 17 is a schematic diagram of a structure of a display panel in some embodiments according to the present disclosure.

FIG. 15 is a schematic diagram of a structure of a display panel in some embodiments according to the present disclosure. FIG. 16 is a schematic diagram of a structure of a display panel in some embodiments according to the present disclosure. FIG. 17 is a schematic diagram of a structure of a display panel in some embodiments according to the present disclosure. In some embodiments, referring to FIG. 15 to FIG. 17, the display panel further includes a third conductive layer 16 on a side of the first conductive layer 11 away from the second conductive layer 14, and in the encapsulated area EA. Optionally, the display panel further includes a third inorganic insulating layer 17 spacing apart the third conductive layer 16 and the first conductive layer 11.

Various appropriate conductive materials and various appropriate fabricating methods may be used to make the third conductive layer. For example, a conductive metal material may be deposited on the substrate by magnetron sputtering, vapor deposition (e.g., plasma-enhanced chemical vapor deposition), or vacuum deposition. Examples of appropriate conductive materials for making the third conductive layer include, but are not limited to, molybdenum, copper, titanium, tantalum, aluminum, molybdenum, chromium, various alloys or laminates thereof, and substantially transparent materials such as indium tin oxide. Optionally, the third conductive layer has a single-layer structure. Optionally, the third conductive layer has a stacked-layer structure including two or more sub-layers.

Optionally, the third conductive layer 16 has a material the same as a material of the first conductive layer 11. Optionally, the third conductive layer 16 has a material the same as a material of the second conductive layer 14. Optionally, the third conductive layer 16 has a material different from materials of the first conductive layer 11 and of the second conductive layer 14.

Various appropriate materials may be used for making the third inorganic insulating layer. Examples of materials suitable for making the third inorganic insulating layer include, but are not limited to, $SiO_x$, $SiO_xN_y$, and $SiN_x$.

By forming the third conductive layer 16 on a side of the first conductive layer 11 away from the second conductive layer 14, the display panel can perform multiple functions.

In some embodiments, referring to FIG. 16 and FIG. 17, when the first conductive layer 11 includes the first gate electrode 111, and the second conductive layer 14 includes the source and drain electrode sub-layer 141, the third conductive layer 16 includes a second gate electrode 161.

Figure 18:
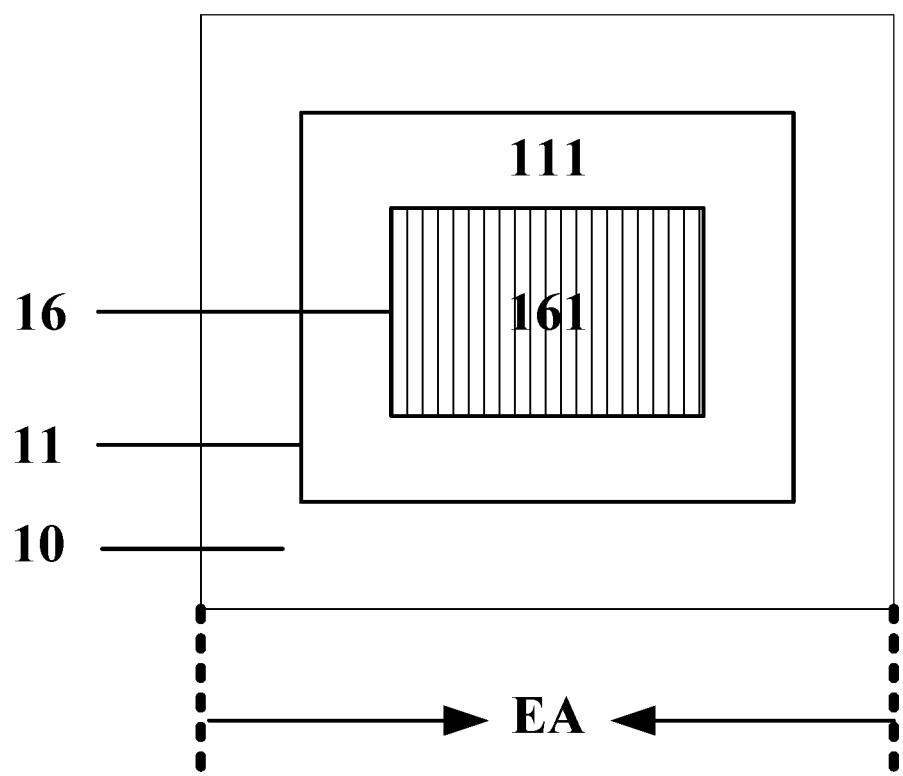
FIG. 18 is a plan view of a first gate electrode and a second gate electrode in some embodiments according to the present disclosure.

FIG. 18 is a plan view of a first gate electrode and a second gate electrode in some embodiments according to the present disclosure. Optionally, referring to FIG. 16, FIG. 17 and FIG. 18, an orthographic projection of the second gate electrode 161 on the base substrate 10 at least partially overlaps with an orthographic projection of the first gate electrode 111 on the base substrate 10. In one example, the orthographic projection of the second gate electrode 161 on the base substrate 10 partially overlaps with the orthographic projection of the first gate electrode 111 on the base substrate 10. In another example, the orthographic projection of the second gate electrode 161 on the base substrate 10 completely overlaps with an orthographic projection of the first gate electrode 111 on the base substrate 10.

In some embodiments, the display panel includes an array substrate, and the array substrate includes a plurality of thin film transistors 23. Optionally, the display panel is an OLED display panel, and the OLED display panel includes a pixel driving circuit. Optionally, the pixel driving circuit is a 2T1C pixel driving circuit which includes driving thin film transistors and switching thin film transistors.

In some embodiments, referring to FIG. 16, FIG. 17, and FIG. 18, the second conductive layer 14 includes the source and drain electrode sub-layer 141 electrically connected to the active layer 231. Since the orthographic projection of the first gate electrode 111 on the base substrate 10 at least partially overlaps with the orthographic projection of the second gate electrode 161 on the base substrate 10, the first gate electrode 111 and the second gate electrode 161 together form a capacitor. For example, the capacitor formed by the first gate electrode 111 and the second gate electrode 161 is a storage capacitor in the pixel driving circuit.

In some embodiments, referring to FIG. 17, the first gate electrode 111 or the second gate electrode 161 is a gate electrode of a driving thin film transistors, and the source electrode S and the drain electrode D are a source electrode and a drain electrode of the driving thin film transistors. The source electrode S and the drain electrode D are electrically connected to the active layer 231.

Optionally, the first gate electrode 111 and the second gate electrode 161 together form a capacitor, for example, the capacitor formed by the first gate electrode 111 and the second gate electrode 161 is a storage capacitor electrically connected to the driving thin film transistor.

For example, referring to FIG. 17 and FIG. 18, the first gate electrode 111 of the first conductive layer 11, the source electrode S and the drain electrode D of the first conductive layer 11, the second gate electrode 161 of the third conductive layer 16, the active layer 231 and other layers can be used to form a thin film transistor and a storage capacitor. The orthographic projection of the first gate electrode 111 on the base substrate 10 at least partially overlaps with the orthographic projection of the second gate electrode 161 on the base substrate 10.

In some embodiments, referring to FIG. 15, an orthographic projection of the first gate electrode 111 on the base substrate 10 is non-overlapping with an orthographic projection of the second gate electrode 161 on the base substrate 10. The first gate electrode 111 and the second gate electrode 161 are two gate electrodes respectively in two adjacent driving thin film transistors. Optionally, the source and drain electrode sub-layer 141 further includes drain electrodes of a plurality of switching thin film transistors. Optionally, two drain electrodes of two switching thin film transistors are respectively electrically connected to the first gate electrode 111 and the second gate electrode 161.

Optionally, by putting gate electrodes of two adjacent driving thin film transistors in a different layer, an aperture ratio of sub-pixels can be increased.

Figure 19:
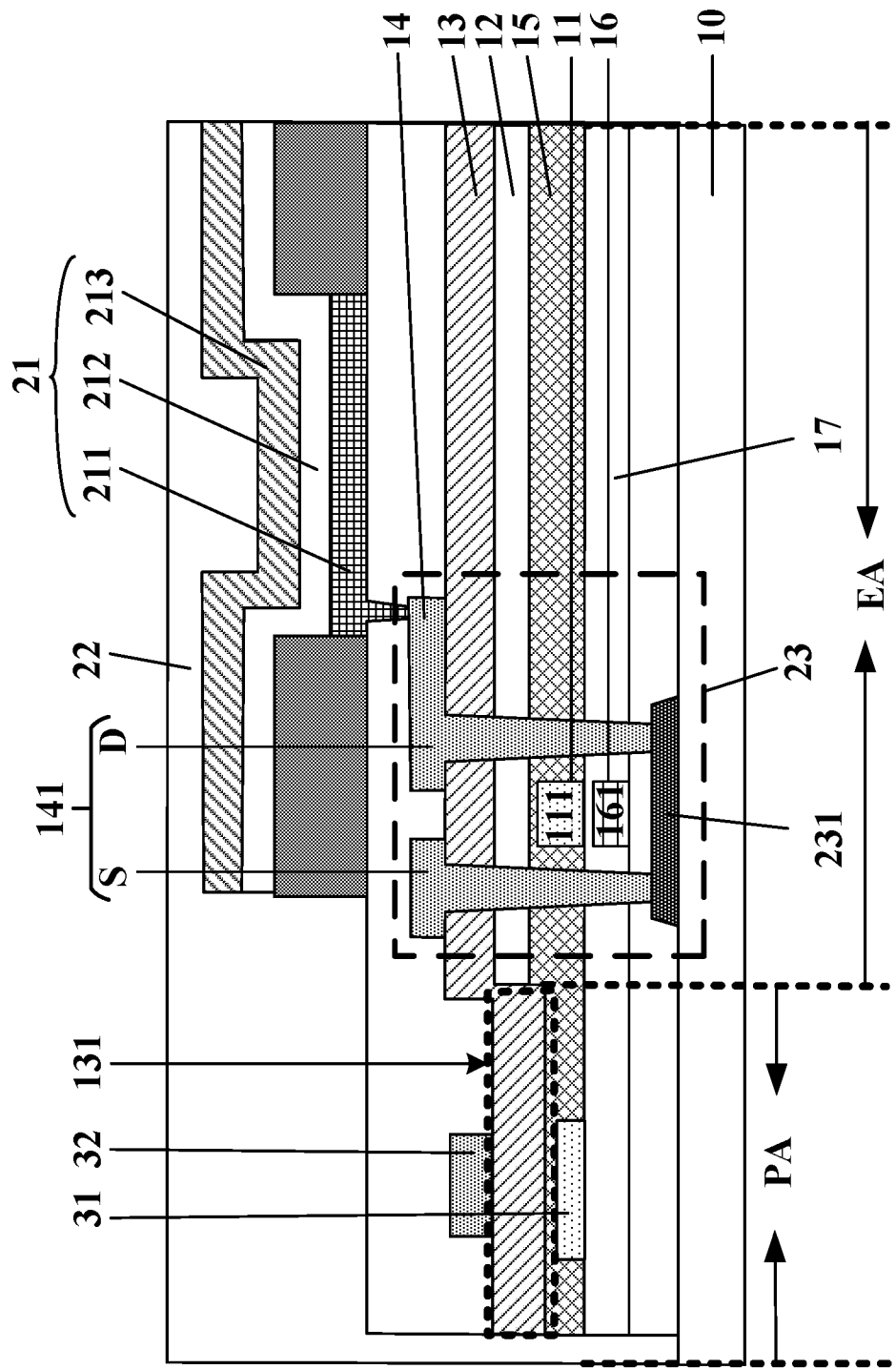
FIG. 19 is a schematic diagram of a structure of a display panel in some embodiments according to the present disclosure.

FIG. 19 is a schematic diagram of a structure of a display panel in some embodiments according to the present disclosure. In some embodiments, referring to FIG. 19, the display panel includes a plurality of light emitting elements 21 in the encapsulated area EA; and an encapsulating layer 22 on a side of the plurality of light emitting elements 21 away from the base substrate 10. Optionally, the encapsulating layer 22 extends from the encapsulated area EA into the peripheral area PA, and is in direct contact with the first inorganic insulating sub-layer 131, thereby encapsulating the plurality of light emitting elements 21.

Optionally, the encapsulating layer 22 is not in direct contact with the organic insulating layer 12 and is spaced apart from the organic insulating layer 12 by the first inorganic insulating layer 13. Optionally, the encapsulating layer 22 is in direct contact with lateral sides of the first inorganic insulating layer 13 and the second inorganic insulating layer 15. Optionally, the encapsulating layer 22 is in direct contact with the third inorganic insulating layer 17 in the peripheral area PA.

In another aspect, the present disclosure provides a display apparatus. In some embodiments, the display apparatus includes the display panel described herein; and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating the display panel. In some embodiments, the method includes forming a first conductive layer on a base substrate, wherein the first conductive layer is formed in an encapsulated area and a peripheral area of the display panel; forming an organic insulating layer prior to forming the first inorganic insulating layer and on a side of the first conductive layer away from the base substrate, wherein the organic insulating layer is formed to be limited in the encapsulated area; forming a first inorganic insulating layer on a side of the organic insulating layer away from the base substrate, wherein the first inorganic insulating layer is formed between the first conductive layer and the second conductive layer; forming a second conductive layer on a side of the organic insulating layer and the first inorganic insulating layer away from the base substrate, wherein the second conductive layer is formed in the encapsulated area and the peripheral area; and forming a second inorganic insulating layer subsequent to forming the first conductive layer and prior to forming the organic insulating layer, the second inorganic insulating layer formed between the organic insulating layer and the first conductive layer. Optionally, forming the first inorganic insulating layer includes forming first inorganic insulating sub-layer in the peripheral area, and a second inorganic insulating sub-layer in the encapsulated area. Optionally, the first inorganic insulating layer covers the organic insulating layer. Optionally, an orthographic projection of the first conductive layer on the base substrate at least partially overlaps with an orthographic projection of the second conductive layer on the base substrate.

Figure 20:
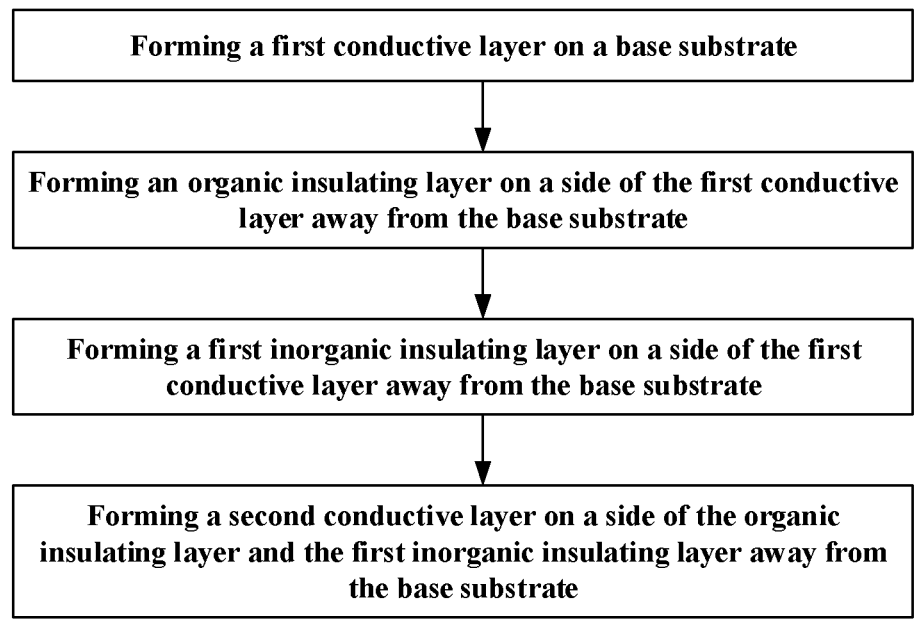
FIG. 20 is a flow char of a method of fabricating a display panel in some embodiments according to the present disclosure.

FIG. 20 is a flow char of a method of fabricating a display panel in some embodiments according to the present disclosure. In some embodiments, referring to FIG. 20, the method of fabricating the display panel includes forming a first conductive layer on a base substrate; forming an organic insulating layer on a side of the first conductive layer away from the base substrate; forming a first inorganic insulating layer on a side of the first conductive layer away from the base substrate; and forming a second conductive layer on a side of the organic insulating layer and the first inorganic insulating layer away from the base substrate.

Optionally, the first conductive layer is formed in an encapsulated area and a peripheral area of the display panel. Optionally, the organic insulating layer is formed to be limited in the encapsulated area. Optionally, the second conductive layer is formed in the encapsulated area and the peripheral area. Optionally, an orthographic projection of the first conductive layer on the base substrate at least partially overlaps with an orthographic projection of the second conductive layer on the base substrate.

Optionally, forming the first inorganic insulating layer comprises forming first inorganic insulating sub-layer in the peripheral area.

Figure 21:
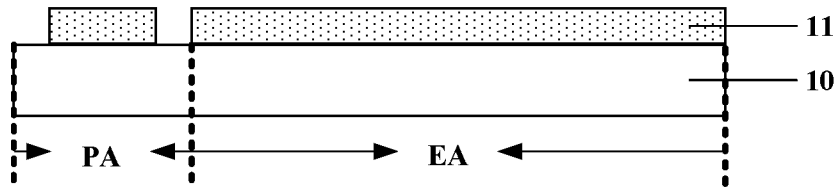
FIG. 21 is schematic diagram of a structure of a display panel in some embodiments according to the present disclosure.

FIG. 21 is schematic diagram of a structure of a display panel in some embodiments according to the present disclosure. In some embodiments, referring to FIG. 21, a first conductive layer 11 is formed on the base substrate 10. Optionally, the first conductive layer 11 is formed in the encapsulated area EA and the peripheral area PA.

Optionally, the base substrate is made of PI or glass.

Optionally, the first conductive layer 11 extends substantially throughout an entirety of the encapsulated area EA and the peripheral area PA. Optionally, the first conductive layer 11 has a first pattern.

Optionally, the first conductive layer 11 includes a conductive material and is configured to be conductive.

Various appropriate conductive materials and various appropriate fabricating methods may be used to make the first conductive layer. For example, a conductive metal material may be deposited on the substrate by magnetron sputtering, vapor deposition (e.g., plasma-enhanced chemical vapor deposition), or vacuum deposition. Examples of appropriate conductive materials for making the first conductive layer include, but are not limited to, molybdenum, copper, titanium, tantalum, aluminum, molybdenum, chromium, various alloys or laminates thereof, and substantially transparent materials such as indium tin oxide. Optionally, the first conductive layer has a single-layer structure. Optionally, the first conductive layer has a stacked-layer structure including two or more sub-layers.

Optionally, the display panel is a self-luminous display panel. Referring to FIG. 7, optionally, a plurality of light emitting elements 21 of the self-luminous display panel is formed on the base substrate 10. An encapsulating layer 22 is formed on the base substrate 10 to encapsulate the plurality of light emitting elements 21 and the organic insulating layer 12. A respective one of the plurality of light emitting elements 21 is an OLED. Optionally, the encapsulating layer 22 has a single-layer structure. Optionally, the encapsulating layer 22 has a multi-layer structure.

In some embodiments, the respective one of the plurality of light emitting elements 21 includes a first electrode layer 211, a light emitting layer 212, and a second electrode layer 213. Optionally, the first electrode layer 211 and the second electrode layer 213 are different electrodes selected from a group consisting of an anode and a cathode.

Figure 22:
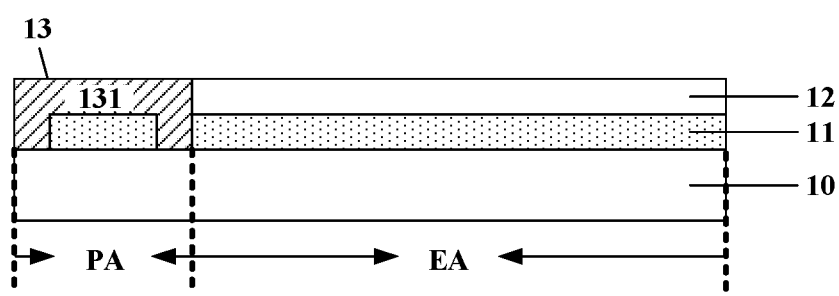
FIG. 22 is schematic diagram of a structure of a display panel in some embodiments according to the present disclosure.

FIG. 22 is schematic diagram of a structure of a display panel in some embodiments according to the present disclosure. In some embodiments, the organic insulating layer 12 and the first inorganic insulating layer 13 are formed on a side of the first conductive layer 11 away from the base substrate 10. Optionally, the organic insulating layer 12 is formed to be limited in the encapsulated area EA.

Optionally, forming the first inorganic insulating layer 13 includes forming the first inorganic insulating sub-layer 131 in the peripheral area PA.

Various appropriate materials may be used for making the organic insulating layer. Examples of materials suitable for making the organic insulating layer include, but are not limited to, resin.

Various appropriate materials may be used for making the first inorganic insulating layer. Examples of materials suitable for making the first inorganic insulating layer include, but are not limited to, SiOx, SiOxNy, and SiNx.

Optionally, the first inorganic insulating sub-layer 131 is formed to space apart the first conductive layer 11 and the second conductive layer 14. For example, a thickness of the first inorganic insulating sub-layer 131 is in a range of 500 Å to 5000 Å, e.g., 500 Å to 1000 Å, 1000 Å to 2000 Å, 2000 Å to 3000 Å, 3000 Å to 4000 Å, and 4000 Å to 5000 Å.

Optionally, the first inorganic insulating sub-layer 131 extends substantially throughout an entire of the peripheral area PA. Optionally, the first inorganic insulating sub-layer 131 is in a portion of the peripheral area PA, as long as the first inorganic insulating sub-layer 131 space apart the first conductive layer 11 and the second conductive layer 14 in the peripheral area PA.

In some embodiments, when the first inorganic insulating layer merely includes the first inorganic insulating sub-layer in the peripheral area, forming the first inorganic insulating layer and the organic insulating layer includes forming an inorganic material layer on the base substrate; and forming an organic material layer on a side of the inorganic material layer away from the base substrate; applying photoresistor on a side of the organic material layer away from the base substrate; exposing and developing the photoresistor to form a first photoresistor pattern; etching the organic material layer to form the organic insulating layer; removing the first photoresistor pattern; applying photoresistor on a side of the organic insulating layer away from the inorganic material layer; exposing and developing the photoresistor to form a second photoresistor pattern; etching the inorganic material layer to form the first inorganic insulating layer; removing the second photoresistor pattern.

When etching the organic material layer, a thickness of the inorganic material layer in the peripheral area should be thick enough to space apart a portion of the first conductive layer in the peripheral area and a portion of the second conductive layer in the peripheral area.

In some embodiments, when the first inorganic insulating layer merely includes the first inorganic insulating sub-layer in the peripheral area, forming the first inorganic insulating layer and the organic insulating layer includes forming the organic material layer on the base substrate; forming the inorganic material layer on a side of the organic material layer away from the base substrate; applying photoresistor on a side of the inorganic material layer away from the base substrate; exposing and developing the photoresistor to form the second photoresistor pattern; etching the inorganic material layer to form the first inorganic insulating layer; removing the second photoresistor pattern; applying the photoresistor on a side of the first inorganic insulating layer away from the base substrate; exposing and developing the photoresistor to form the first photoresistor pattern; etching the organic material layer to form the organic insulating layer; and removing the first photoresistor pattern.

In some embodiments, when the first inorganic insulating layer merely includes the first inorganic insulating sub-layer, forming the first inorganic insulating layer and the organic insulating layer includes forming the first inorganic insulating layer on the base substrate using a first patterning process; and forming the organic insulating layer on a side of the first inorganic insulating layer away from the base substrate using a second patterning process.

When forming the organic insulating layer using an etching process, a thickness of the inorganic insulating layer in the peripheral area should be thick enough to space apart a portion of the first conductive layer in the peripheral area and a portion of the second conductive layer in the peripheral area.

In some embodiments, when the first inorganic insulating layer merely includes the first inorganic insulating sub-layer, forming the first inorganic insulating layer and the organic insulating layer includes forming the organic insulating layer on the base substrate using the second patterning process; and forming the inorganic insulating layer on a side of the organic insulating layer away from the base substrate using the first patterning process.

Referring to FIG. 3, forming the second conductive layer 14 includes forming the second conductive layer 14 in the encapsulated area EA and the peripheral area PA. The orthographic projection of the first conductive layer 11 on the base substrate 10 at least partially overlaps with an orthographic projection of the second conductive layer 14 on the base substrate 10. In one example, the orthographic projection of the first conductive layer 11 on the base substrate 10 partially overlaps with an orthographic projection of the second conductive layer 14 on the base substrate 10. In another example, the orthographic projection of the first conductive layer 11 on the base substrate 10 completely overlaps with an orthographic projection of the second conductive layer 14 on the base substrate 10.

Optionally, the second conductive layer 14 extends substantially throughout an entirety of the encapsulated area EA and the peripheral area PA. Optionally, the second conductive layer 11 has a second pattern.

Various appropriate conductive materials and various appropriate fabricating methods may be used to make the second conductive layer. For example, a conductive metal material may be deposited on the substrate by magnetron sputtering, vapor deposition (e.g., plasma-enhanced chemical vapor deposition), or vacuum deposition. Examples of appropriate conductive materials for making the second conductive layer include, but are not limited to, molybdenum, copper, titanium, tantalum, aluminum, molybdenum, chromium, various alloys or laminates thereof, and substantially transparent materials such as indium tin oxide. Optionally, the second conductive layer has a single-layer structure. Optionally, the second conductive layer has a stacked-layer structure including two or more sub-layers.

Optionally, the first conductive layer 11 and the second conductive layer 14 include a same material. Optionally, a material of the first conductive layer 11 is different from a material of the second conductive layer 14.

For example, referring to FIG. 6, an orthographic projection of a first portion 1101 of the first conductive layer 11 in the peripheral area PA completely overlaps with an orthographic projection of a second portion 1401 of the second conductive layer 14 in the peripheral area PA. The first portion 1101 of the first conductive layer 11 and the second portion 1401 of the second conductive layer 14 forms a capacitor. For example, the capacitor is a capacitor in the circuit of Gate-On-Array (GOA).

In the encapsulating area EA, optionally, the first conductive layer 11 is electrically connected to the second conductive layer 14, optionally, the first conductive layer 11 is spaced apart from the second conductive layer 14.

For example, the display panel is an OLED display panel. The OLED display panel includes an array substrate which includes a plurality of thin film transistors. A respective one of the plurality of thin film transistors is a top-gate thin film transistors. In the encapsulating area, a portion of the first conductive layer in the encapsulating area is formed to include gate electrodes of the plurality of thin film transistors. A portion of the second conductive layer is formed to include source electrodes and the gate electrodes of the plurality of thin film transistors. The organic insulating layer is formed to be an inter-layer insulating layer of the respective one of the plurality of thin film transistors and between the first conductive layer and the second conductive layer.

In some embodiments, referring to FIG. 10 and FIG. 11, forming the first inorganic insulating layer 13 further includes forming a second inorganic insulating sub-layer 132 in the encapsulated area EA. Optionally, the first inorganic insulating sub-layer 131 and the second inorganic insulating sub-layer 132 are formed as a unitary layer continuously extending from the encapsulated area EA into the peripheral area PA.

Optionally, the second inorganic insulating sub-layer is formed to have a thickness in a range of 500 Å to 1000 Å, e.g., 500 Å to 600 Å, 600 Å to 700 Å, 700 Å to 800 Å, 800 Å to 900 Å, and 900 Å to 1000 Å.

Referring to FIG. 10, optionally, the second inorganic insulating sub-layer 132 is formed on a side of the organic insulating layer 12 away from the base substrate 10. Referring to FIG. 11, optionally, the second inorganic insulating sub-layer 132 is formed on a side of the organic insulating layer 12 closer to the base substrate 10. For example, the first inorganic insulating sub-layer 131 is thick enough to space apart the first electrode 31 and the second electrode 32.

Optionally, the second inorganic insulating sub-layer 132 and the organic insulating layer 12 have a same pattern. Optionally, the second inorganic insulating sub-layer 132 and the organic insulating layer 12 have different patterns.

For example, when the second inorganic insulating sub-layer 132 and the organic insulating layer 12 have a same pattern, vias extending into the second inorganic insulating sub-layer 132 and vias extending into the organic insulating layer 12 can be formed in a same etching process.

Optionally, the thickness of the second inorganic insulating sub-layer 132 is in a range of 500 Å to 1000 Å, e.g., 500 Å to 600 Å, 600 Å to 700 Å, 700 Å to 800 Å, 800 Å to 900 Å, and 900 Å to 1000 Å. The second inorganic insulating sub-layer 132 is thinner than an inter-layer insulating layer 234 of a conventional thin film transistor. If a flexible display panel has a thinner inorganic layer, it is easier for the flexible display panel to be bent. So, the inorganic layers described in the present disclosure are thinner and will have little adverse effect on a flexibility of a flexible display panel.

The first inorganic insulating layer 13 includes the first inorganic insulating sub-layer 131 in the peripheral area PA and the second inorganic insulating sub-layer 132 in the encapsulated area EA, and the first inorganic insulating sub-layer 131 and the second inorganic insulating sub-layer 132 together form the unitary layer, which can lower the cost of fabricating the display panel, because to form the first inorganic insulating sub-layer 131 and the second inorganic insulating sub-layer 132, merely an organic material layer is formed on the base substrate, it is unnecessary to etch a portion of organic material layer in the encapsulated area EA, so no mask is needed for etching the portion of organic material layer in the encapsulated area EA.

Optionally, when vias extends into the second inorganic insulating sub-layer 132, vias extending into the second inorganic insulating sub-layer 132 and vias extending into the organic insulating layer 12 are formed in a same process.

In some embodiments, referring to FIG. 12, the prior to forming the first inorganic insulating layer 13, the organic insulating layer 12 is formed on a side of the first conductive layer 11 away from the base substrate 10. Subsequent to forming the first conductive layer 11 and prior to forming the organic insulating layer 12, the method further comprises forming a second inorganic insulating layer 15 on a side of the first conductive layer 11 away from the base substrate 10. Optionally, forming the second inorganic insulating layer 15 includes forming a third inorganic insulating sub-layer 151 in the encapsulated area EA.

Various appropriate materials may be used for making the second inorganic insulating layer. Examples of materials suitable for making the second inorganic insulating layer include, but are not limited to, $SiO_x$, $SiO_xN_y$, and $SiN_x$.

Optionally, the second inorganic insulating layer 15 and the first inorganic insulating layer 13 include a same materials. Optionally, a material of the second inorganic insulating layer 15 is different from a material of the first inorganic insulating layer 13.

The first conductive layer 11 can be in better contact with inorganic materials than with organic materials. When the first inorganic insulating layer 13 is on a side of the organic insulating layer 12 away from the base substrate 10, the second inorganic insulating layer 15 is formed between the first conductive layer 11 and the organic insulating layer 12. by forming the first inorganic insulating layer 13 on a side of the organic insulating layer 12 away from the base substrate 10, in the process of forming the organic insulating layer 12, the first inorganic insulating layer 13 will not be etched.

Referring to FIG. 13A, forming the second inorganic insulating layer 15 further includes forming a fourth inorganic insulating sub-layer 152 in the peripheral area PA. Optionally, the third inorganic insulating sub-layer 151 and the fourth inorganic insulating sub-layer 152 are formed as a unitary layer continuously extending from the encapsulated area EA into the peripheral area PA. Optionally, the fourth inorganic insulating sub-layer 152 is formed to have a thickness equal to or less than a thickness of the third inorganic insulating sub-layer 151.

Because the second inorganic insulating layer 15 is on a side of the organic insulating layer 12 closer to the base substrate 10, prior to forming the organic insulating layer 12, an inorganic material layer is formed on the base substrate 10, and the inorganic material layer is used to form the second inorganic insulating layer 15; an organic material layer is formed on a side of the inorganic material layer away from the base substrate, and the organic material layer is used to form the organic insulating layer 12. Because the organic insulating layer 12 is limited in the encapsulated area EA, a portion of the organic material layer in the peripheral area PA should be removed using etching. In the process of etching, in one example, there may be over-etching on the inorganic material layer, so that the thickness of the fourth inorganic insulating sub-layer 152 is less than the thickness of the third inorganic insulating sub-layer 151; in another example, there may not be over-etching on the inorganic material layer and the portion of the organic material layer is completed removed from the peripheral area PA, the thickness of the fourth inorganic insulating sub-layer 152 is equal to the thickness of the third inorganic insulating sub-layer 151.

Because the second inorganic insulating layer 15 is between the first conductive layer 11 and the second conductive layer 14, the fourth inorganic insulating sub-layer 152 of the second inorganic insulating layer 15 can cooperate with the first inorganic insulating sub-layer 131 of the first inorganic insulating layer 13 to space apart the first conductive layer 11 and the second conductive layer 14, especially when the first inorganic insulating sub-layer 131 is relatively thin.

In some embodiments, forming the first conductive layer comprises forming a first gate electrode in the encapsulated area, and a first electrode in the peripheral area; and forming the second conductive layer comprises forming a source electrode and a drain electrode in the encapsulated area, and a second electrode in the peripheral area. Optionally, an orthographic projection of the first electrode on the base substrate at least partially overlaps with an orthographic projection of the second electrode on the base substrate.

In some embodiments, the method further includes forming a third conductive layer on a side of the first conductive layer away from the second conductive layer, wherein the third conductive layer is formed in the encapsulated area; and forming a third inorganic insulating layer spacing apart the first conductive layer and the third conductive layer.

In some embodiments, forming the third conductive layer comprises forming a second gate electrode. Optionally, an orthographic projection of the second gate electrode on the base substrate at least partially overlaps with an orthographic projection of the first gate electrode on the base substrate.

In some embodiments, the method further includes forming a plurality of light emitting elements in the encapsulated area; and forming an encapsulating layer on a side of the plurality of light emitting elements away from the base substrate. Optionally, the encapsulating layer is formed to extend from the encapsulated area into the peripheral area, and is formed to be in direct contact with the first inorganic insulating sub-layer to encapsulate the plurality of light emitting elements.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a display panel, comprising:
   forming a first conductive layer on a base substrate, wherein the first conductive layer is formed in an encapsulated area and a peripheral area of the display panel, wherein the encapsulated area and the peripheral area are non-overlapping to each other;
   forming an organic insulating layer on a side of the first conductive layer away from the base substrate, wherein the organic insulating layer is formed to be limited in the encapsulated area;
   forming a first inorganic insulating layer on a side of the organic insulating layer away from the base substrate;
   forming a second conductive layer on a side of the organic insulating layer and the first inorganic insulating layer away from the base substrate, wherein the second conductive layer is formed in the encapsulated area and the peripheral area; and
   forming a second inorganic insulating layer subsequent to forming the first conductive layer and prior to forming the organic insulating layer, the second inorganic insulating layer formed between the organic insulating layer and the first conductive layer;
   wherein forming the first inorganic insulating layer comprises forming first inorganic insulating sub-layer in the peripheral area, and a second inorganic insulating sub-layer in the encapsulated area;
   the first inorganic insulating layer is formed between the first conductive layer and the second conductive layer;
   the organic insulating layer is formed prior to forming the first inorganic insulating layer;
   the first inorganic insulating layer covers the organic insulating layer; and
   an orthographic projection of the first conductive layer on the base substrate at least partially overlaps with an orthographic projection of the second conductive layer on the base substrate.

2. The method of claim 1, wherein the first inorganic insulating layer is formed as a unitary layer continuously extending from the encapsulated area into the peripheral area.

3. The method of claim 1, wherein the first inorganic insulating layer is formed to have a thickness in a range of 500 Å to 1000 Å.

4. The method of claim 1, wherein forming the second inorganic insulating layer further comprises forming a third inorganic insulating sub-layer in the encapsulated area, and a fourth inorganic insulating sub-layer in the peripheral area; and
   the second inorganic insulating layer is formed as a unitary layer continuously extending from the encapsulated area into the peripheral area.

5. The method of claim 4, wherein the fourth inorganic insulating sub-layer is formed to have a thickness equal to or less than a thickness of the third inorganic insulating sub-layer.

6. The method of claim 1, wherein forming the first conductive layer comprises forming a first gate electrode in the encapsulated area, and a first electrode in the peripheral area; and forming the second conductive layer comprises forming a source electrode and a drain electrode in the encapsulated area, and a second electrode in the peripheral area;

wherein an orthographic projection of the first electrode on the base substrate at least partially overlaps with an orthographic projection of the second electrode on the base substrate.

7. The method of claim 1, further comprises:

forming a third conductive layer on a side of the first conductive layer away from the second conductive layer, wherein the third conductive layer is formed in the encapsulated area; and forming a third inorganic insulating layer spacing apart the first conductive layer and the third conductive layer.

8. The method of claim 7, wherein forming the third conductive layer comprises forming a first gate electrode and a second gate electrode in the encapsulated area; and an orthographic projection of the second gate electrode on the base substrate at least partially overlaps with an orthographic projection of the first gate electrode on the base substrate.

9. The method of claim 1, further comprising:

forming a plurality of light emitting elements in the encapsulated area; and forming an encapsulating layer on a side of the plurality of light emitting elements away from the base substrate;

wherein the encapsulating layer is formed to extend from the encapsulated area into the peripheral area, and is formed to be in direct contact with the first inorganic insulating sub-layer to encapsulate the plurality of light emitting elements.

* * * * *